(12) United States Patent
Long et al.

(10) Patent No.: US 7,531,394 B2
(45) Date of Patent: May 12, 2009

(54) MANUFACTURING METHOD FOR A TFT LCD ARRAY SUBSTRATE

(75) Inventors: Chunping Long, Beijing (CN); Jigang Zhao, Beijing (CN); Seung Moo Rim, Beijing (CN)

(73) Assignee: BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 11/767,600

(22) Filed: Jun. 25, 2007

(65) Prior Publication Data

US 2007/0298554 A1   Dec. 27, 2007

(30) Foreign Application Priority Data

Jun. 23, 2006   (CN) .......................... 2006 1 0082971
Jun. 23, 2006   (CN) .......................... 2006 1 0082972

(51) Int. Cl.
    H01L 21/00   (2006.01)
(52) U.S. Cl. .................. 438/155; 438/152; 438/153; 438/154; 438/E27.111
(58) Field of Classification Search ......... 438/151–155, 438/149, 48–52; 257/59, 72, 751; 349/114, 349/129, 139, 156
See application file for complete search history.

(56) References Cited

U.S. PATENT DOCUMENTS

| | | | |
|---|---|---|---|
| 2006/0141685 A1 * | 6/2006 | Kim et al. .................... | 438/149 |
| 2007/0246707 A1 | 10/2007 | Deng | |
| 2007/0272926 A1 | 11/2007 | Deng | |
| 2008/0030639 A1 | 2/2008 | Qiu | |
| 2008/0061295 A1 | 3/2008 | Wang | |
| 2008/0100766 A1 | 5/2008 | Ming | |

(Continued)

FOREIGN PATENT DOCUMENTS

JP   03-249735   11/1991

(Continued)

OTHER PUBLICATIONS

U.S. Appl. No. 11/958,613, filed Dec. 18, 2007, Zhangtao Wang.

(Continued)

*Primary Examiner*—Dung A. Le
(74) *Attorney, Agent, or Firm*—Hasse & Nesbitt LLC; Daniel F. Nesbitt

(57) ABSTRACT

The present invention discloses a method for manufacturing a TFT LCD array substrate by utilizing the gray tone mask technology and the photoresist lifting-off technology with only two masks in two photolithography processes, and to a TFT LCD array substrate manufactured by the same. In the resultant array substrate, the gate line and the data line are perpendicular to and intersect with each other to define the pixel area, and one of the gate line and the data line is continuous and the other is discontinuous. The array substrate is covered with a passivation protection film. The disconnected gate line or the data line is connected together through the via holes formed in the passivation protection film and the connecting conductive film formed on the passivation protection film. The data line and the source electrode and drain electrode of the TFT are made of the same conductive film, and the connecting conductive film and the pixel electrode are made of the same conductive film in the same photolithography process.

18 Claims, 24 Drawing Sheets

U.S. PATENT DOCUMENTS

| | | |
|---|---|---|
| 2008/0105873 A1 | 5/2008 | Wang |
| 2008/0105874 A1 | 5/2008 | Wang |
| 2008/0111136 A1 | 5/2008 | Qiu |
| 2008/0111934 A1 | 5/2008 | Wu |
| 2008/0117347 A1 | 5/2008 | Zhang |
| 2008/0123007 A1 | 5/2008 | Cui |
| 2008/0123030 A1 | 5/2008 | Song |
| 2008/0142802 A1 | 6/2008 | Qiu |
| 2008/0142819 A1 | 6/2008 | Liu |

FOREIGN PATENT DOCUMENTS

| | | |
|---|---|---|
| JP | 04-348144 | 12/2004 |
| KR | 2006-68442 | 6/2006 |

OTHER PUBLICATIONS

U.S. Appl. No. 11/958,634, filed Dec. 18, 2007, Chunping Long.

U.S. Appl. No. 12/104,575, filed Apr. 17, 2008, Xinxin Li.

\* cited by examiner

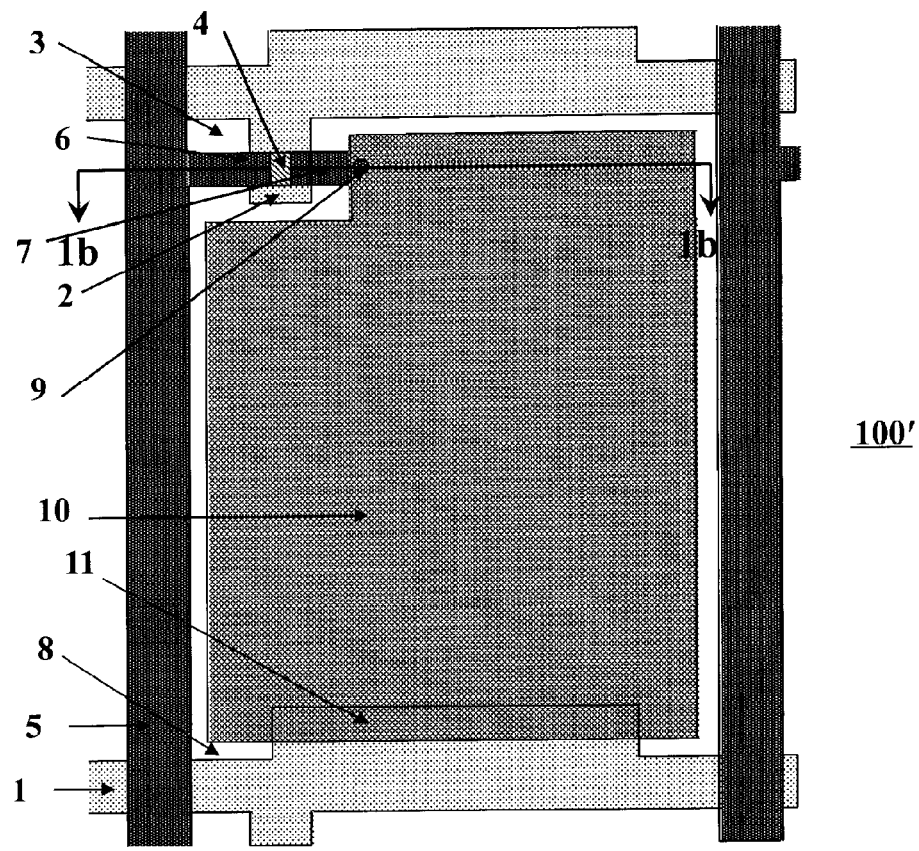
Figure 1a – Prior Art
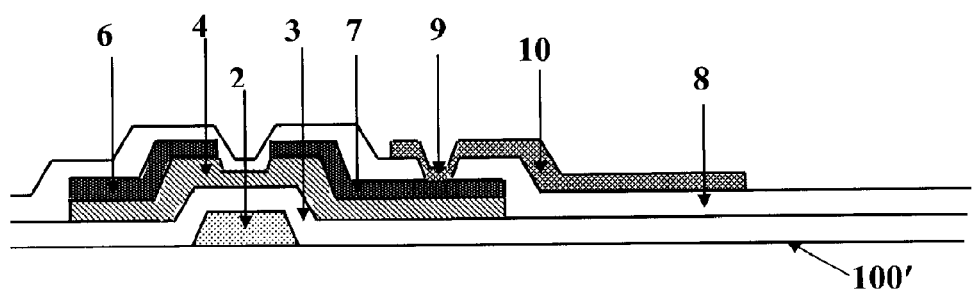
Figure 1b – Prior Art

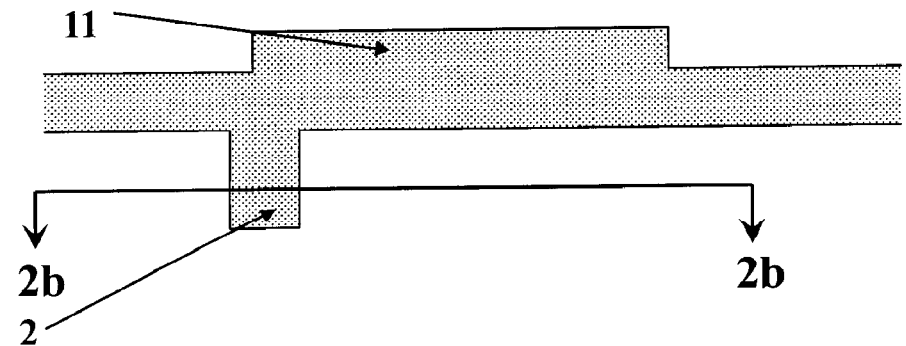
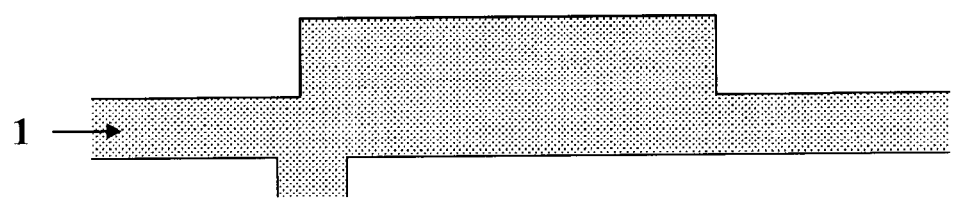
Figure 2a – Prior Art
Figure 2b – Prior Art

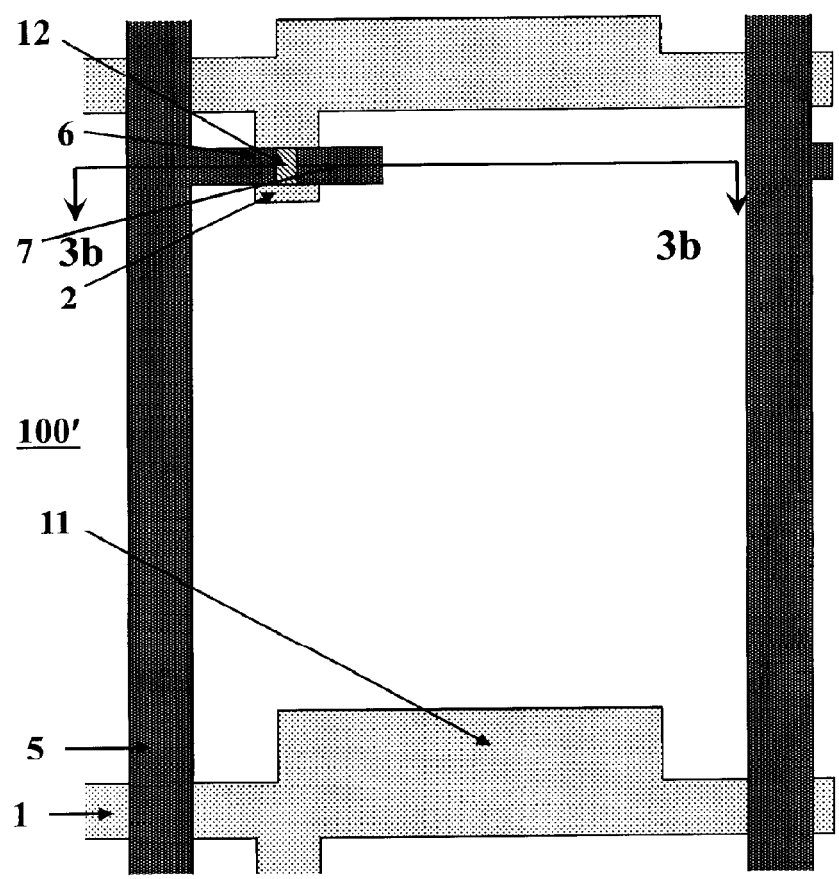
Figure 3a – Prior Art
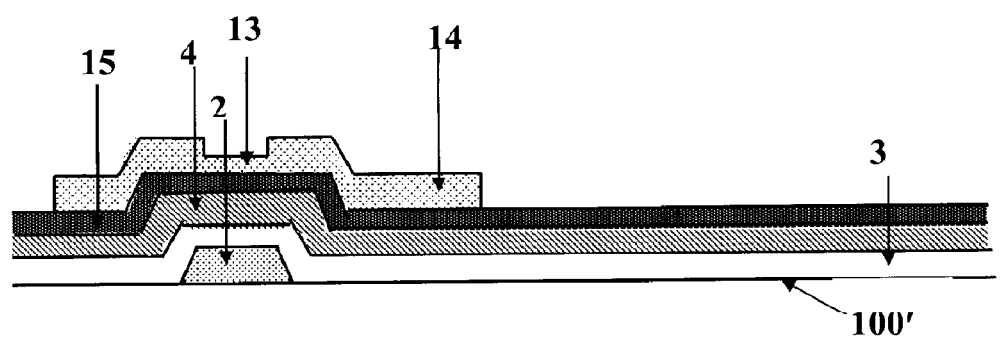
Figure 3b – Prior Art

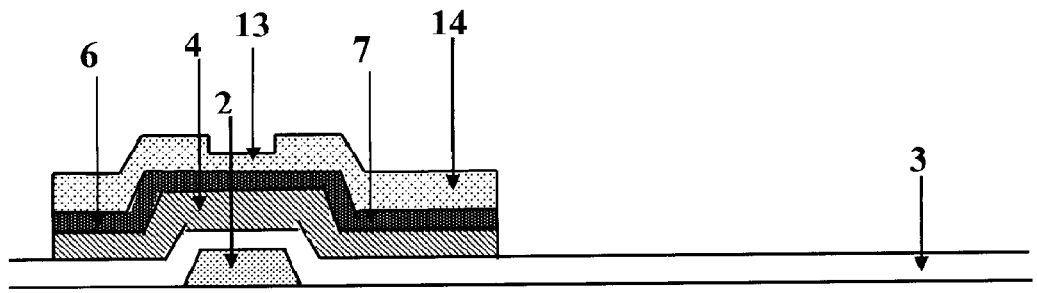
Figure 3c – Prior Art
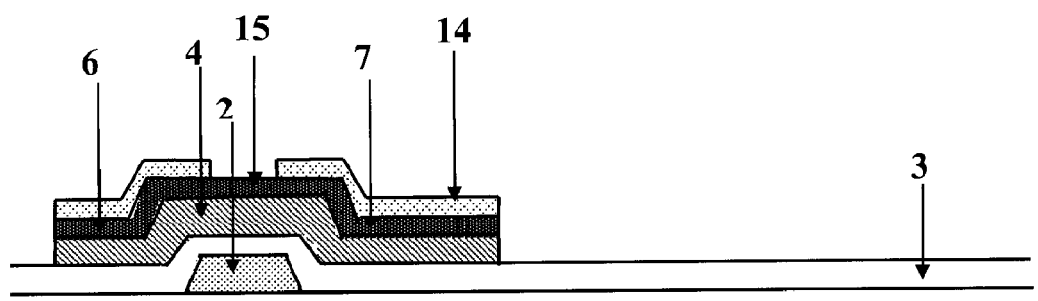
Figure 3d – Prior Art
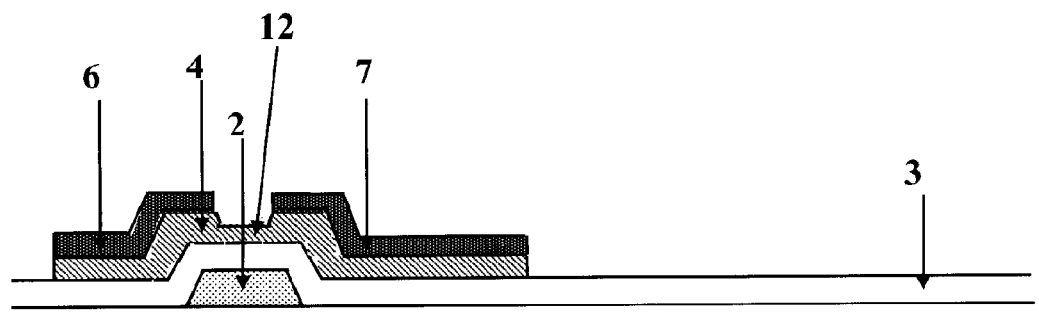
Figure 3e – Prior Art

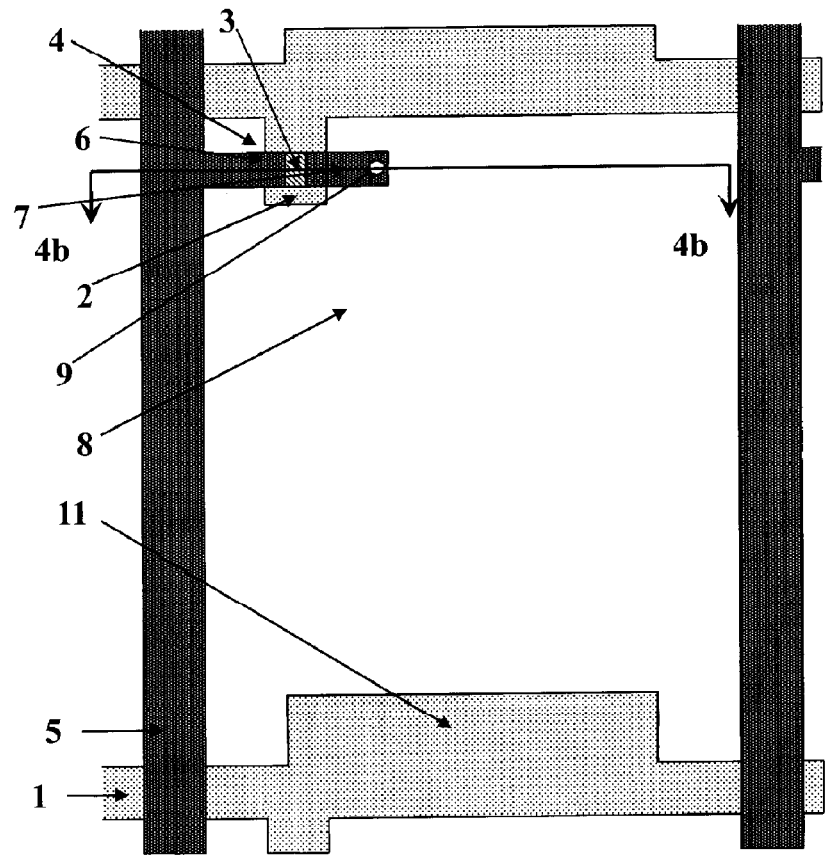
Figure 4a – Prior Art
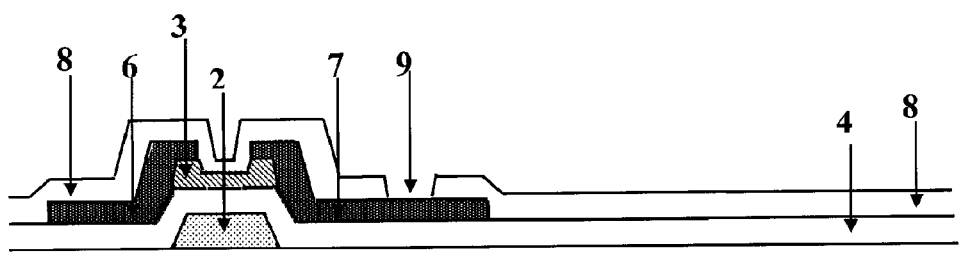
Figure 4b – Prior Art

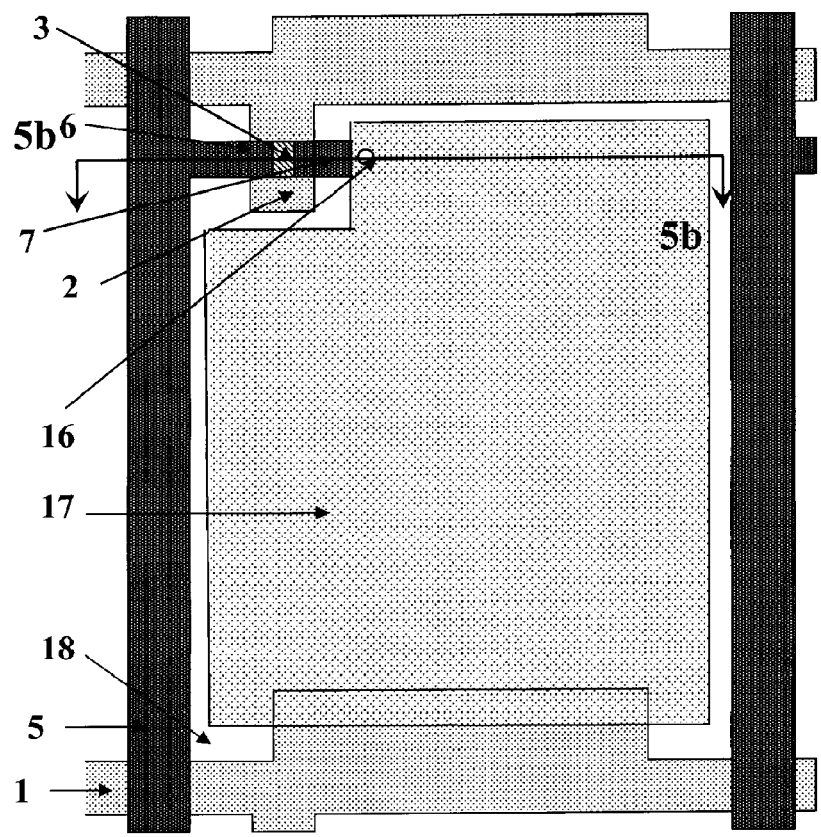
Figure 5a – Prior Art
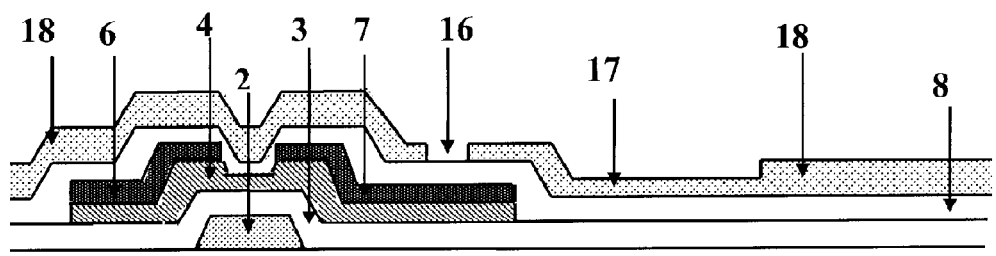
Figure 5b – Prior Art

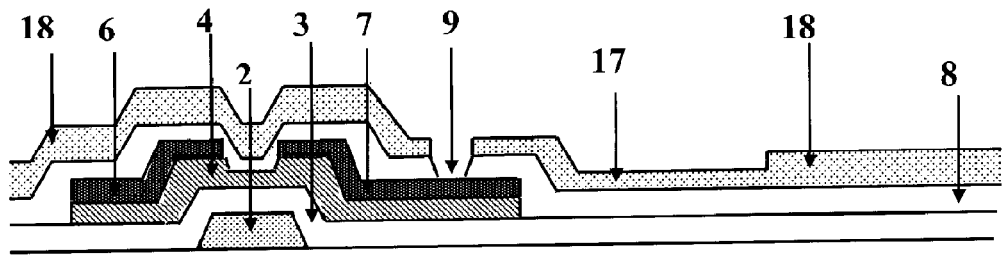
Figure 5c – Prior Art
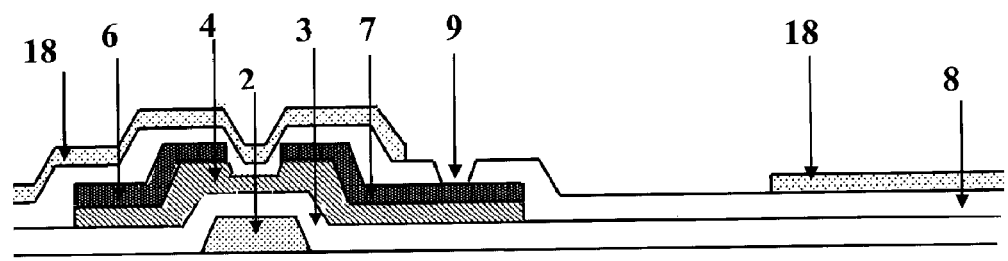
Figure 5d – Prior Art
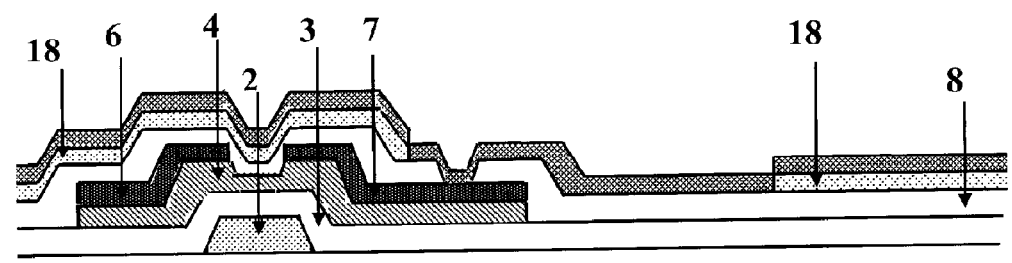
Figure 5e – Prior Art
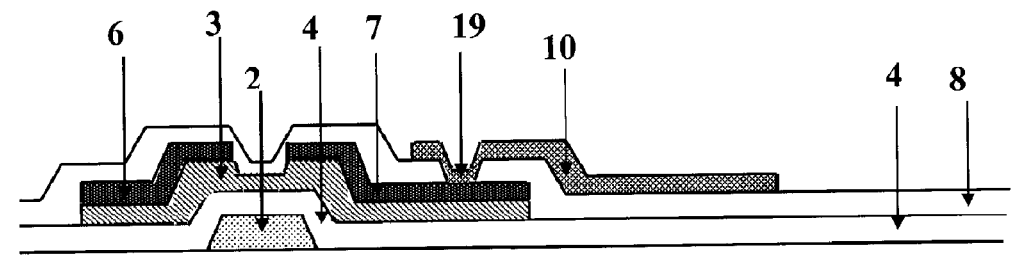
Figure 5f – Prior Art Step 1: Forming the gate line and gate electrode, the gate insulating film, the active layer, the source and drain electrodes Step 2: Forming the passivation film and the transparent pixel electrode

MANUFACTURING METHOD FOR A TFT LCD ARRAY SUBSTRATE

FIELD OF THE INVENTION

The present invention relates to a thin film transistor liquid crystal display (TFT LCD) array substrate and a manufacturing method thereof, and more particularly, to a TFT LCD array substrate manufactured with two masks and a manufacturing method thereof.

BACKGROUND OF THE INVENTION

In a liquid crystal display (LCD), the optical anisotropy and polarization characteristic of the liquid crystal molecule can be varied through controlling the orientation of the liquid crystal molecule, which in turn varies with the external electric field applied thereto, thus the refraction of light and display of images can be realized. Among various LCDs, the active matrix LCD has attracted much research and development and been widely used in consumer electronics and computers due to their high resolution and superiority in animation display. The active matrix LCD comprises thin film transistors (TFTs) and pixel electrodes arranged in matrix.

The LCD typically comprises an upper substrate, a lower substrate, and liquid crystal layer interposed therebetween. The upper substrate is called a color filter substrate, typically including a common electrode and a color filter. The lower substrate is called an array substrate, typically including TFTs and pixel electrodes. The color filter can be formed on the color filter substrate with several photolithography processes, and the TFTs and pixel electrodes arranged in matrix can be formed on the array substrate in 4-6 photolithography processes, each of which is carried out with repeated thin film deposition, exposure, etching, lifting off and the like. One mask is used in each circle of photolithography process During manufacturing of TFT LCD, there always exists a need of reducing mask number and accordingly photolithography process number to reduce manufacture cost and improve equipment productivity. The manufacturing technology for TFT LCD array substrate has undergone the map from the seven mask (7 Mask) technology to the current five mask (5 Mask) and four mask (4 Mask) technology used in mass production, and also three mask (3 Mask) technology has been developed.

As mask number decreases, the structure of TFT is evolving continuously. The structure has evolved from co-planar type to normal staggered type, and further to back channel stop type and the back channel etching type, and has also evolved from top gate structure to current bottom gate structure. Removal of some device elements during the evolution of TFT directly results in decrease of the photolithography process number and mask number. For example, the bottom gate type TFT needs no light shielding layer that is used in the top gate type TFT, thus reducing one mask. Also back channel etching type TFT, as compared with the back channel stop type TFT, needs no the etch blocking layer, thus reducing another mask.

After improvement on TFT structure, methods for reducing mask number in the industry shift to the photolithography process itself, i.e., defining different patterns of two layers of thin films with one mask. As well known, the necessary elements of a LCD pixel unit comprise a gate electrode, a gate insulating film, an active film, an ohmic contact film and a source/drain electrode, a transparent pixel electrode, and a TFT passivation protection film. In the 5 Mask process in mass production, the gate electrode, the gate insulating film and the active film as well as the ohmic contact film, the source/drain electrode, the passivation protection film, and the pixel electrode are separately formed in five photolithography processes with respective mask. However, for the 4 Mask process, the gate insulating film, the active film, the ohmic contact film, and the source/drain electrode are formed with one mask in combination. This mask differs from any mask in the 5 Mask process and is a so-called gray tone mask with narrow slits and bars. This mask forms stepwise photoresist with different thicknesses in different regions.

For the conventional mask, transparent and opaque portions are formed thereon and patterned the same as desired device pattern. The opaque portions are generally made of a metal film (e.g., Cr), while the transparent portions are void of any metal film. On the contrary, the gray tone mask additionally has partially transparent regions, e.g., slits with given width and spacing and arranged in order in given regions of the mask. The diffraction among the incident light changes transmitting ratio, so the photoresist corresponding to the partially transparent regions of the mask is subject to exposure different from that corresponding to the transparent regions, and the so-called photoresist partially exposed (gray tone) region is formed. Compared with the photoresist completely unexposed (full tone) region, the photoresist in the gray tone region is subject to partial exposure and is thinner than that in the full tone region.

The 4 Mask technology using a gray tone mask will be explained below with reference to the drawings.

FIGS. 1a and 1b are diagrams illustrating an array substrate 100' of typical back channel etching bottom-gate type TFT. The array substrate comprises a plurality of gate lines 1 and gate electrodes 2; a plurality of data lines 5 and source and drain electrodes 6 and 7; and pixel electrodes 10. A part of the gate electrode (gate protrusion part 11 overlapping with the pixel) and the pixel electrode 10 together constitute a storage capacitor. The TFT is manufactured with a 4 Mask process. FIGS. 2a-4b show the top view of TFT substrate and cross-sectional view across the TFT at each intermediate stage of the process. The conventional manufacturing process comprises the following steps.

A gate metal film is formed on a transparent substrate, and a gate pattern, which includes the gate line 1 and gate electrode 2 as well as the gate protrusion part 11 for constituting the storage capacitor, is formed with the first mask by photolithography and etching process, as shown in FIGS. 2a and 2b.

A gate insulating film 3, a semiconductor film 4 (e.g. an intrinsic semiconductor film), an ohmic contact film (not shown and e.g., a doped semiconductor film) and a source/drain metal film 15 are formed in order. Stepwise photoresist pattern as shown in FIG. 3b is defined with a second mask, a gray tone mask, wherein the photoresist 13 (partially retained in gray tone region) over the TFT channel is thinner than the photoresist 14 (completely retained in full tone photoresist) over the source/drain electrode and data line. The source electrode 6, the drain electrode 7, and the data line 5 are formed after etching, as shown in FIG. 3c. After the photoresist is completely removed in the gray tone region, the source/drain metal film 15 and the doped semiconductor film are further etched to form TFT conductive channel 12, as shown in FIGS. 3d and 3e.

On the array substrate a second insulating dielectric film, i.e., the passivation protection film 8 is formed, and a third mask is used to define the protection film, as shown in FIGS. 4a and 4b, i.e., via hole 9 and connection pad (not shown) for the wires of the gate and source electrodes.

A transparent conductive film is formed on the passivation protection film 8, and a pixel electrode 10 is formed with a fourth mask, thereby achieving the TFT device as shown in FIGS. 1a and 1b.

Based on the 4 Mask technology, a 3Mask technology has been developed, in which the protection film and the transparent conductive film in the above process are completed in combination with a single mask. This modification is illustrated in FIGS. 5a-5f, in which the transparent pixel electrode pattern is defined by the photoresist lifting-off process used in the semiconductor integrated circuit. First, as shown in FIG. 5b, the photoresist 17 in the photoresist partially retained region (corresponding to the pixel electrodes) and photoresist 18 in the photoresist completely retained region are formed with a gray tone mask, and the photoresist-free via holes 16 are in the photoresist-free region. The passivation protection film via holes 9 are formed by etching through the photoresist-free via holes 16 (FIG. 5c); the photoresist 17 in the photoresist partially retained region is removed (FIG. 5d); a layer of transparent conductive film is formed in all the regions (FIG. 5e); finally the retained photoresist and the transparent conductive film deposited thereon are lift off, and the pixel electrode 10 and the conductive film 19 in the via holes are retained. The TFT structure manufactured by the lifting-off technology is shown in FIG. 5f.

Compared with the conventional 4 Mask technology, the 3 Mask technology simplifies the manufacturing processes and improves the utilization ratio of the equipment, but it still suffers from the drawbacks such as complicated manufacturing process, low productivity, and low utilization ratio of the equipment.

SUMMARY OF THE INVENTION

An aspect of the present invention is a TFT LCD array substrate manufactured with two masks and the manufacturing method of the same, which overcome the drawbacks in the conventional technology. The aim of providing 2 Mask manufacture process is to avoid the drawbacks and limitations associated with the 5 Mask or 4 Mask methods described above. More specifically, the present invention simplifies the manufacture process of the TFT LCD array substrate, removes the drawbacks in the process, and improves the yield, and furthermore reduces the number of the used masks to improve the equipment utilization ratio and productivity.

The present invention provides a method for manufacturing a TFT LCD array substrate by utilizing the gray tone mask technology and the photoresist lifting-off technology with only two masks in two photolithography processes, and a TFT LCD array substrate manufactured by the same. In the resultant array substrate, the gate line and the data line are perpendicular to and intersect with each other to define the pixel area, and one of the gate line and the data line is continuous and the other is discontinuous. The array substrate is covered with a passivation protection film. The segments of the disconnected gate line or the data line are connected together through the via hole formed in the passivation protection film and the connecting conductive film formed on the passivation protection film. The data lines and the source and drain electrodes of the TFT are made of the same source/drain metal film, and the connecting conductive film and the pixel electrode are made of the same conductive film in the same photolithography process.

With the gray tone mask and the photoresist lifting-off technology, the TFT LCD array substrate can be manufactured by using only two masks in two photolithography processes, so that the manufacture process can be simplified and the production cost can be reduced. In the TFT LCD array substrate, the connection of the segments of the discontinuous gate lines or data lines, the connection of the source electrodes and the data lines, and the connection of the gate lines, the data lines, and the external circuit, are all achieved by a transparent conductive film with the second gray tone mask in manufacturing.

The present invention will be described in detail by reference to the accompanying drawings and the particular embodiments.

BRIEF DESCRIPTION OF THE DRAWING

FIG. 1a is a top view of a typical TFT LCD pixel manufactured by the 4 Mask process in the conventional technology, and FIG. 1b is a cross-sectional view along the line 1b-1b in FIG. 1a.

FIG. 2a is a top view showing a pixel after the first mask process in the conventional technology, and FIG. 2b is a cross-sectional view along the line 2b-2b in FIG. 2a.

FIG. 3a is a top view of a pixel after the second mask process in the conventional technology, FIG. 3b is a cross-sectional view along the line 3b-3b of the pixel after a photoresist pattern is formed on the source/drain electrode, FIG. 3c is a cross-sectional view along the line 3b-3b of the pixel after the source/drain electrode are etched, FIG. 3d is a cross-sectional view along the line 3b-3b of the pixel after the photoresist in the photoresist partially retained region is removed, and FIG. 3e is a cross-sectional view along the line 3b-3b of the pixel after the etching of the doped semiconductor is completed and the photoresist is lift off.

FIG. 4a is a top view showing the pixel after the third mask process in the conventional technology, and FIG. 4b is a cross-sectional view along the line 4b-4b in FIG. 4a.

FIG. 5a is a top view of a pixel after a photoresist pattern is formed on the passivation film in the conventional technology;

FIG. 5b is a cross-sectional view along the line 5b-5b of the pixel after a photoresist pattern is formed on the passivation film;

FIG. 5c is a cross-sectional view along the line 5b-5b of the pixel after the passivation film is etched for via holes;

FIG. 5d is a cross-sectional view along the line 5b-5b of the pixel after the photoresist in the photoresist partially retained region is removed;

FIG. 5e is a cross-sectional view along the line 5b-5b of the pixel after the conductive film is deposited; and FIG. 5f is a cross-sectional view along the line 5b-5b of the pixel after the photosensitive material is lift off.

DESCRIPTION OF THE PREFERRED EMBODIMENTS

The TFT LCD array substrate and the preferred embodiments thereof according to the present invention will be described in detail with reference to the drawings.

The First Embodiment

Figure 6:
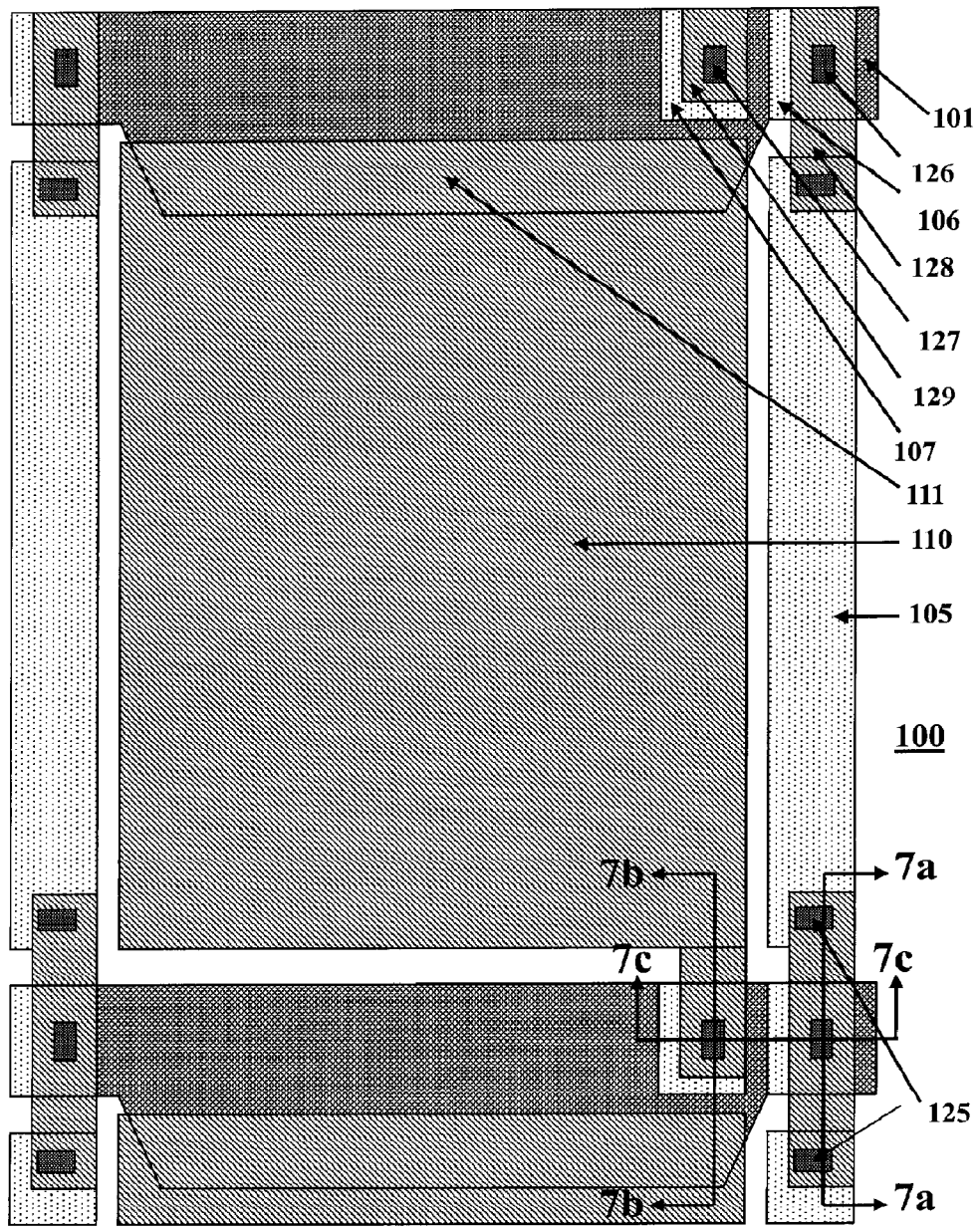
FIG. 6 is a top view showing a single pixel of a TFT LCD array substrate according to the first embodiment of the present invention.

FIG. 6 is a top view showing a pixel of an array substrate according to the first embodiment of the present invention.

As shown, the array substrate according to the first embodiment comprises a transparent insulating substrate 100 on which are formed a gate line 101 and a data line 105, which are perpendicular to and intersect with each other to define a pixel area. The TFT for each pixel is formed at intersection of the gate line 101 and the data line 105 and completely over the gate line 101. The TFT includes a gate electrode, a gate insulating film 103, an intrinsic semiconductor film 133, a doped semiconductor film 134, a source electrode 106 and a drain electrode 107 (which are parts of the source/drain metal film 115, as shown in FIG. 7c). A storage capacitor is formed between the gate line protrusion part 111 and the pixel electrode 110. Of the storage capacitor, the gate protrusion part 111 is the bottom electrode, and the pixel electrode 110 is the top electrode. The pixel electrode 110 is connected with the drain electrode 107 through the via hole 127, rendering the drain electrode 107 communicate with the storage capacitor.

Each gate line 101 is continuous on the substrate 100, while the data line 105 is interrupted by the gate line 101 to be discontinuous but is connected through the via holes 125 over the data line by the conductive film 128 connecting the data line. The source electrode 106 is formed over the intersection of the gate line 101 with the extension line of the data lie 105, and is not directly connected with the data line 105 but through the via hole 126 over the source electrode and the conductive film 128. As shown, the conductive film 128 simultaneously connects the discontinuous data line 105 and the source electrode 106 over the gate line 101.

Figure 7A:
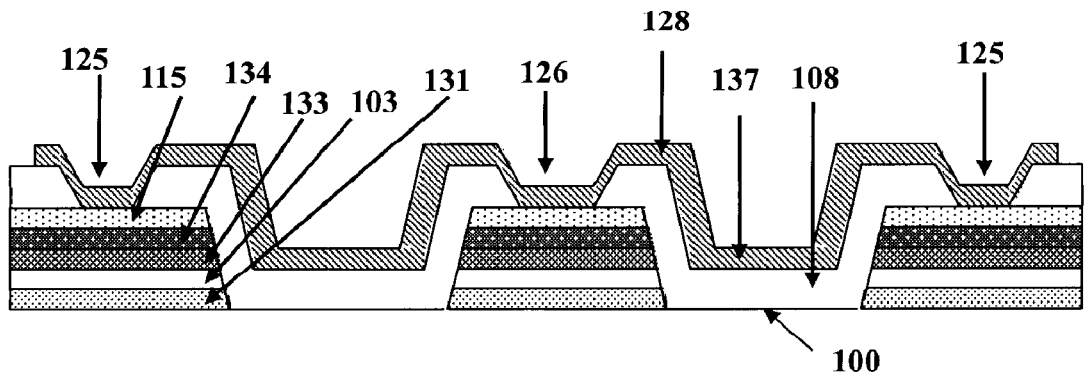
FIG. 7a is a cross-sectional view along the line 7a-7a in FIG. 6.
Figure 7B:
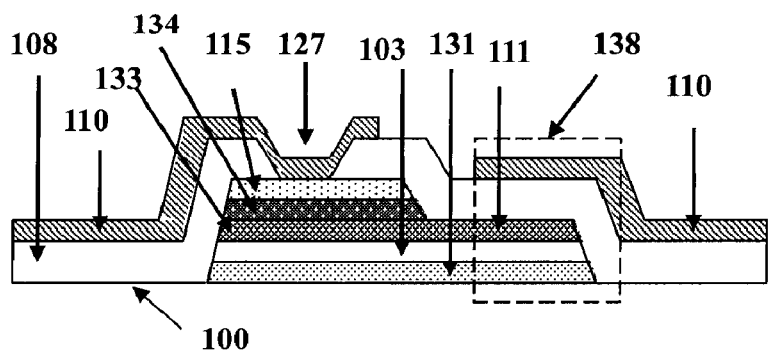
FIG. 7b is a cross-sectional view along the line 7b-7b in FIG. 6.
Figure 7C:
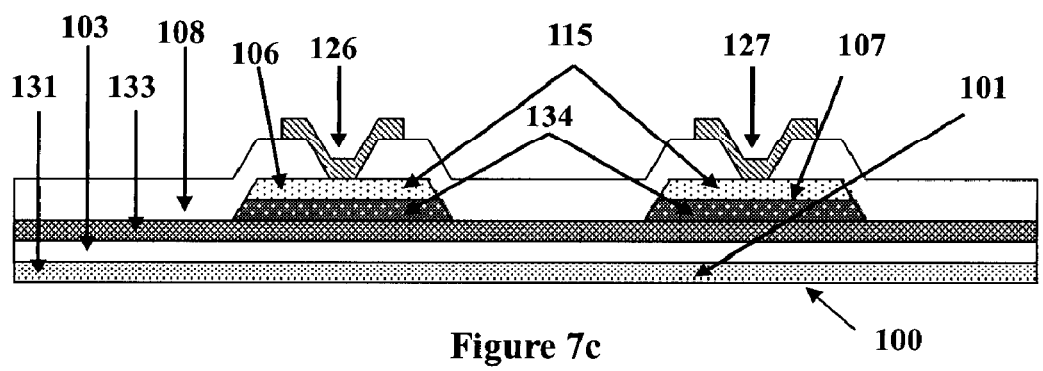
FIG. 7c is a cross-sectional view along the line 7c-7c in FIG. 6.

FIGS. 7a-7c are cross-sectional views along the lines 7a-7a, 7b-7b, and 7c-7c in FIG. 6, respectively. The gate metal film 131 is formed on the transparent substrate, and at a portion of the gate line 101, i.e., the gate line protrusion part 111 in FIG. 6, constitutes an electrode of the storage capacitor 138. The gate metal film 131 is made of material with low resistivity and high reflectivity. The gate insulating film 103 and the intrinsic semiconductor film 133 entirely cover the gate metal film 131, except the lead pads in peripheral region of the array substrate. The ohmic contact film is made of the doped semiconductor film 134 and only retains in the region contacted with the source/drain metal film 115.

As shown in the FIG. 7a, the middle isolated island of the source/drain metal film 115 forms the source electrode 106 in FIG. 6. The source/drain metal films 115 on both sides constitute the data line 105 in FIG. 6 and are interrupted by the gate line 101 formed of the gate metal film 131 under the isolated island of source/drain metal thin film 115. The passivation protection film 108 is formed on the entire substrate, in which via holes 125 are formed over both ends of the data line 105 and the via hole 126 is formed over the source electrode 106. The conductive film 128 connecting the data line connects the interrupted source/drain metal film 115, which forms the data line 105 and the source electrode 106. The conductive film 128 and the transparent conductive film constituting the pixel electrode are of the same material and formed with the same mask.

The source/drain metal film 115 shown in FIG. 7b constitutes the drain electrode 107 in FIG. 6 and is connected with the pixel electrode 110 formed by the conductive film 137 through the via hole 127 over the drain electrode. The transparent conductive film 137 forms the pixel electrode 110 of a neighboring pixel and forms an electrode for the storage capacitor 138, thus constituting the storage capacitor 138 with the metal film 131 under the gate line protrusion part 111, the gate insulating film 103, and the intrinsic semiconductor film 133.

A TFT device shown in FIG. 7c includes the gate line 101, the gate insulating film 103, the intrinsic semiconductor film 133, the doped semiconductor film 134, and the drain electrode 107. The conductive film 137 on the via hole 126 over the source electrode is connected with the data line 105, and the conductive film 137 on the via hole 127 over the drain electrode is connected with the pixel electrode 110. The TFT is entirely formed on the gate metal film 131 to improve the aperture ratio of the pixel area.

As shown, the gate insulating film 103 prevents contact between the gate metal film 131 and the source/drain metal film 115, and the passivation protection film 108 prevents contact between the conductive film 137 and the gate metal film 131 and makes the source/drain metal film 115 contact with the transparent conductive film 137 in the predetermined regions.

Figure 8:
FIG. 8 is a flow chart of the process according to the first embodiment of the present invention.
Figure 9:
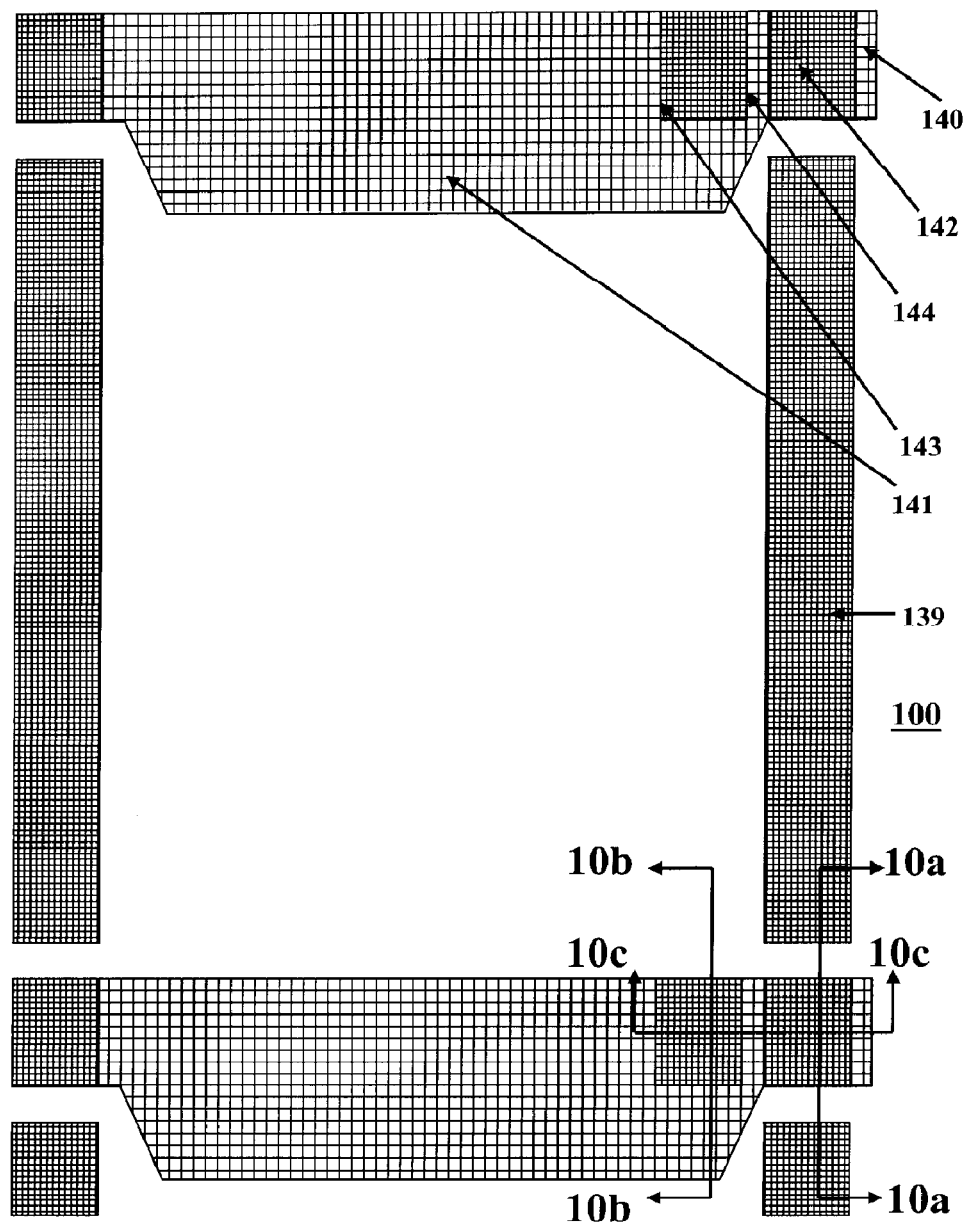
FIG. 9 is a top view showing a single pixel of a TFT LCD array substrate after a photoresist pattern is defined by the first gray tone mask, according to the first embodiment of the present invention.
Figure 10A:
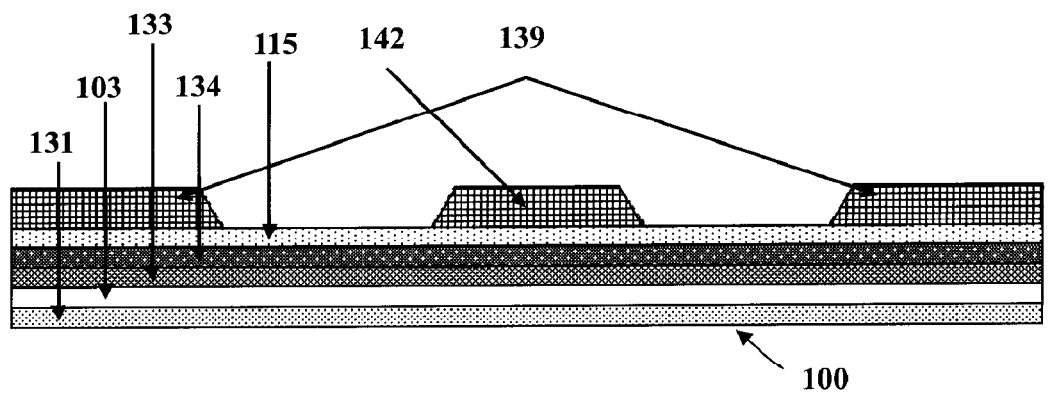
FIG. 10a is a cross-sectional view along the line 10a-10a in FIG. 9.
Figure 10B:
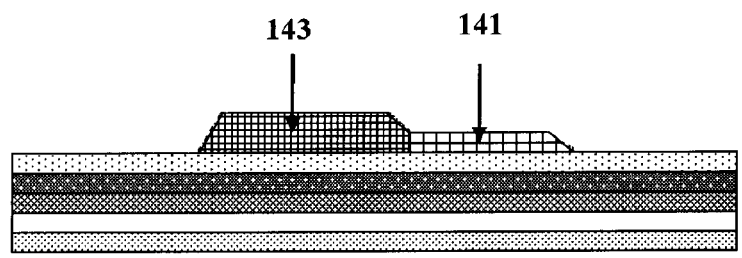
FIG. 10b is a cross-sectional view along the line 10b-10b in FIG. 9.
Figure 10C:
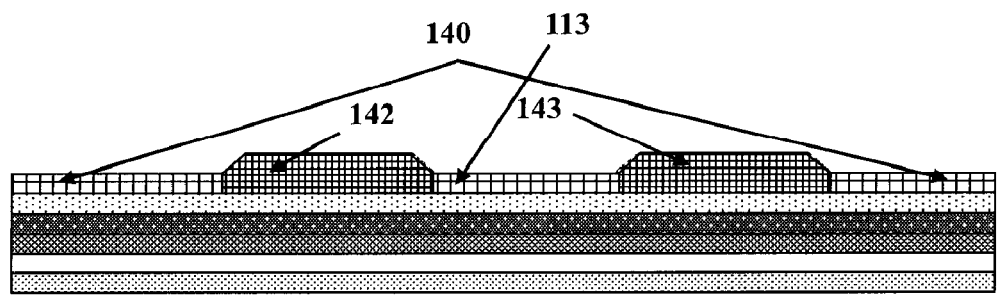
FIG. 10c is a cross-sectional view along the line 10c-10c in FIG. 9.
Figure 11:
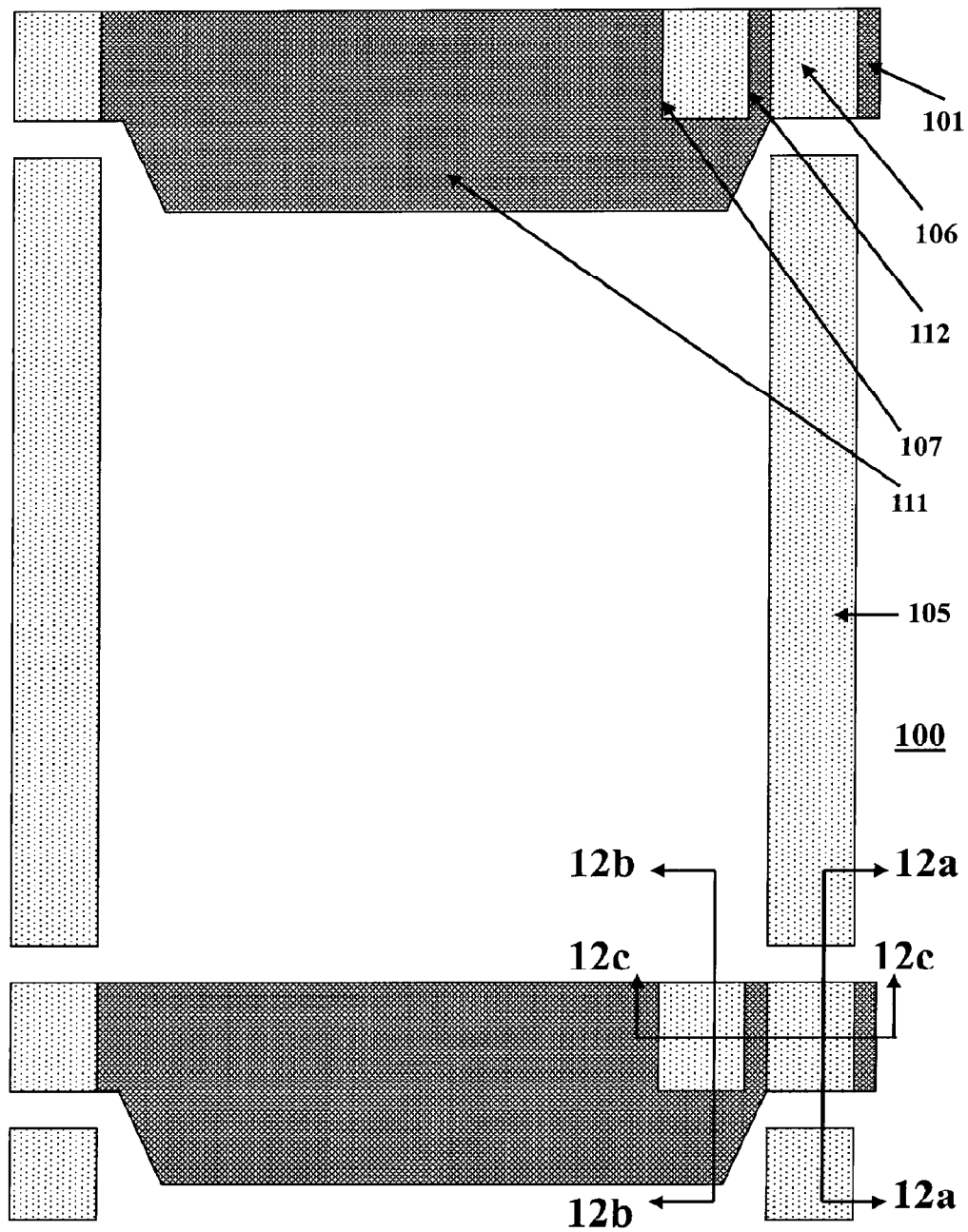
FIG. 11 is a top view showing a single pixel of a TFT LCD array substrate after a photoresist pattern is defined with the first gray tone mask, according to the first embodiment of the present invention.
Figure 12A:
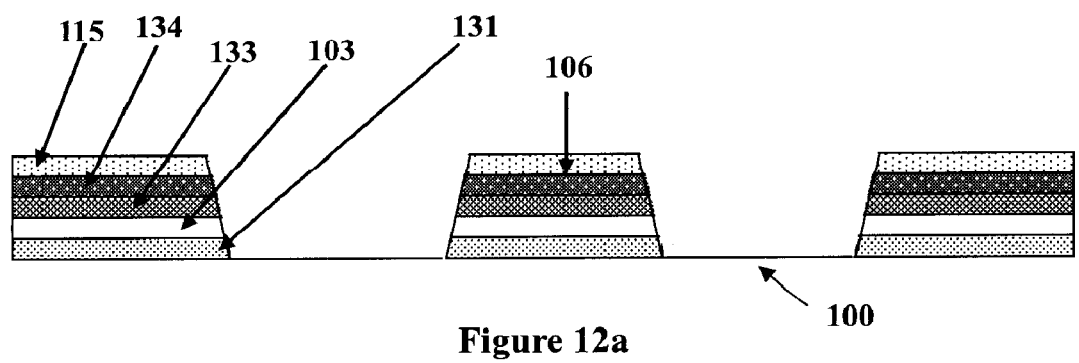
FIG. 12a is a cross-sectional view along the line 12a-12a in FIG. 11
Figure 12B:
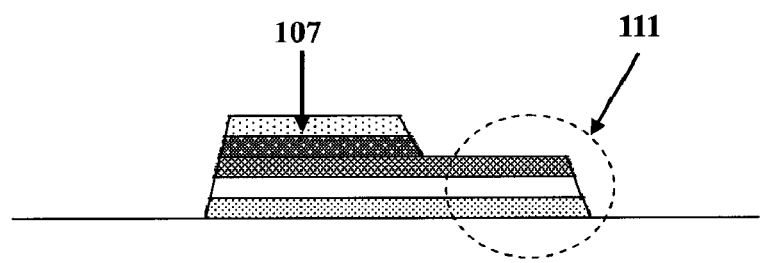
FIG. 12b is a cross-sectional view along the line 12b-12b in FIG. 11.
Figure 12C:
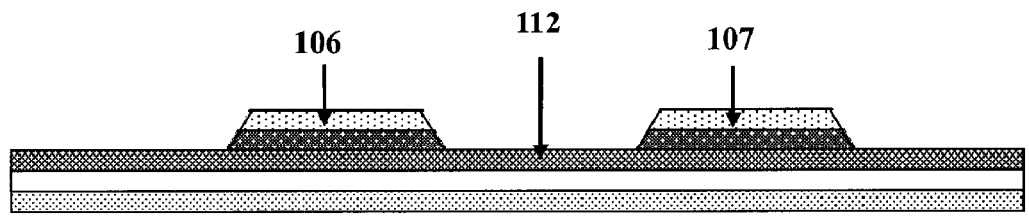
FIG. 12c is a cross-sectional view along the line 12c-12c in FIG. 11.

The manufacture process for the array substrate of the above structure will be illustrated with reference to FIGS. 8-14. FIG. 8 is a flow chart illustrating the process for manufacturing the above array substrate with two masks. FIG. 9 is a top view showing the array substrate after the photoresist with different thickness is defined by a gray tone mask in the first step. FIGS. 10a-10c are cross-sectional views along the line 10a-10a, 10b-10b, and 10c-10c in FIG. 9, respectively.

In the first step shown in FIG. 8 and FIGS. 10a-10c, the gate metal film 131, the gate insulating film 103, the intrinsic semiconductor film 133, the doped semiconductor film 134, and the source/drain metal film 115 are deposited in order on the transparent insulating substrate. The gate metal film 131 and the source/drain metal film 115 can be formed by a same or similar process such as magnetron sputtering, evaporation, etc. and made of the materials with low resistance such as Mo, Al, Al—Ni alloy, Cr, Cu, etc. The gate insulating film 103, the intrinsic semiconductor film 133, and the doped semiconductor film 134 can be successively formed by the same method within the same equipment, for example by chemical vapor deposition (CVD). The gate insulating film 103 is usually made of silicon oxide, silicon nitride, silicon oxynitride, etc. The intrinsic semiconductor film 133 and the doped semiconductor film 134 are made of amorphous silicon, microcrystalline silicon, polycrystalline silicon, etc.

The photoresist pattern shown in FIG. 9 and further in FIGS. 10a-10c is formed on the source/drain metal film 115 with the first gray tone mask. The photoresist pattern on the source/drain metal film 115 in the respective portions comprises: a photoresist completely retained (full tone) region, including the photoresist 139 over the data line, the photoresist 142 over the source electrode, and the photoresist 143 over the drain electrode; a photoresist partially retained (gray tone) region, including the photoresist 140 over the gate line, the photoresist 141 over the gate line protrusion part, and the photoresist 113 over the TFT channel; and a photoresist-free region in the rest of the substrate.

The thickness of the photoresist in the photoresist partially retained region is less than that in the photoresist completely retained region. For this first gray tone mask, the opaque portion includes two layers of thin film material, which may be chrome and chromium oxide, the partially transparent portion includes one layer of thin film material, which may be chromium oxide only, and the fully transparent portion is free of the above thin film material. In addition, the partially transparent portion of the gray tone mask may includes slits and bars with given spacing and in the predetermined direction.

Similar to the process in FIG. 3b-3e, on the substrate with the photoresist pattern defined with the first gray tone mask, the source/drain metal film 115, the doped semiconductor film 134, the intrinsic semiconductor film 133, the gate insulating film 103, and the gate metal film 131 are etched in order to form the data line 105, the source electrode 106, and the drain electrode 107, respectively. The photoresist is subject to the photoresist ashing process, so that the photoresist in the photoresist partially retained region is removed, while the photoresist in the photoresist completely retained region is partially retained. Then the etching of source/drain metal film 115 in the photoresist partially retained region (the photoresist on which has been removed) and the etching of the doped semiconductor film 134 are performed in order to form the gate line 101, the gate line protrusion part 111 for the storage capacitor 138, and the TFT channel 112, respectively. The source/drain metal film 115 establishes an ohmic contact with the doped semiconductor film 134 in the regions of the source electrode 106 and the drain electrode 107. Thus, the structure shown in FIG. 11 and FIGS. 12a-12c is formed.

During the above etching process, different etching methods, etching solutions, and etching gases can be used to ensure the control over the selection ratio among different materials, the profile, and the critical dimension (CD). During the formation of the data line 105, the source electrode 106, and the drain electrode 107, for example, the gate insulating film 103, the intrinsic semiconductor film 133, and the doped semiconductor film 134 can be etched by similar methods, i.e., plasma etching or reactive ion etching (RIE), and the etching of the three layers of films can be performed in the same equipment by adjusting the etching gas and the etching conditions. The etching of the above different films can be performed in the same equipment with different combination of the etching gases of $SF_6$, $Cl_2$, $O_2$, He, etc. and different selected gas flux. For example, the combination of $SF_6$, $Cl_2$, and He can be used to etch the semiconductor film; the combination of $SF_6$, $O_2$, and He can be used to etch the insulating film; and the combination of $Cl_2$ and $O_2$ can be used to etch the metal film. For the optimization of device structure and high process efficiency, the etching parameters for the different films, e.g., plasma power, pressure, and distance between the electrodes, are different from each other. The etching of semiconductor film is usually performed in a plasma chamber with relatively low pressure and high power, which produces more intensive ion bombardment and sputtering etching; the etching of insulating thin film and metal thin film is usually performed in a plasma chamber with relatively high pressure and low power, which produces more intensive chemical reactive ion etching (RIE). For example, the semiconductor film can be removed efficiently by feeding into the equipment $SF_6$ in tens of standard cubic centimeters per minute (sccm) and $Cl_2$ in thousands of sccm with the power of thousands of watts and the pressure in tens of mTorr (microns of Hg); the insulating film can be removed efficiently by feeding into the equipment $SF_6$ in hundreds of sccm and $O_2$ in hundreds of sccm with the power of thousands of watts and the pressure in hundreds of mTorr. During the formation of the data line 105, the source electrode 106 and the source/drain electrode 107, the source/drain metal film can be removed by the etching with chemical etching solution and also can be removed by the plasma etching or RIE, depending on the material of the source/drain metal film. For example, the metal film can be removed efficiently by feeding into the dry etching equipment with $Cl_2$ in hundreds to thousands of sccm and $O_2$ in thousands of sccm and with the power of thousands of watts and the pressure in hundreds of mTorr. During the formation of the gate line 101, the gate line protrusion part 111, the insulating dielectric of the storage capacitor 138, and the TFT channel 112, by the plasma etching or RIE with the above conditions, the source/drain metal film 115 and the doped semiconductor film 134 can be successively etched and removed in the same equipment. The wet etching is only used to remove the metal thin film, in which a mixed solution of nitric acid, hydrochloric acid, and acetic acid in given ratio of concentration is commonly used, and is performed by immersing or spraying at the temperature of tens of Celsius degrees.

Figure 13:
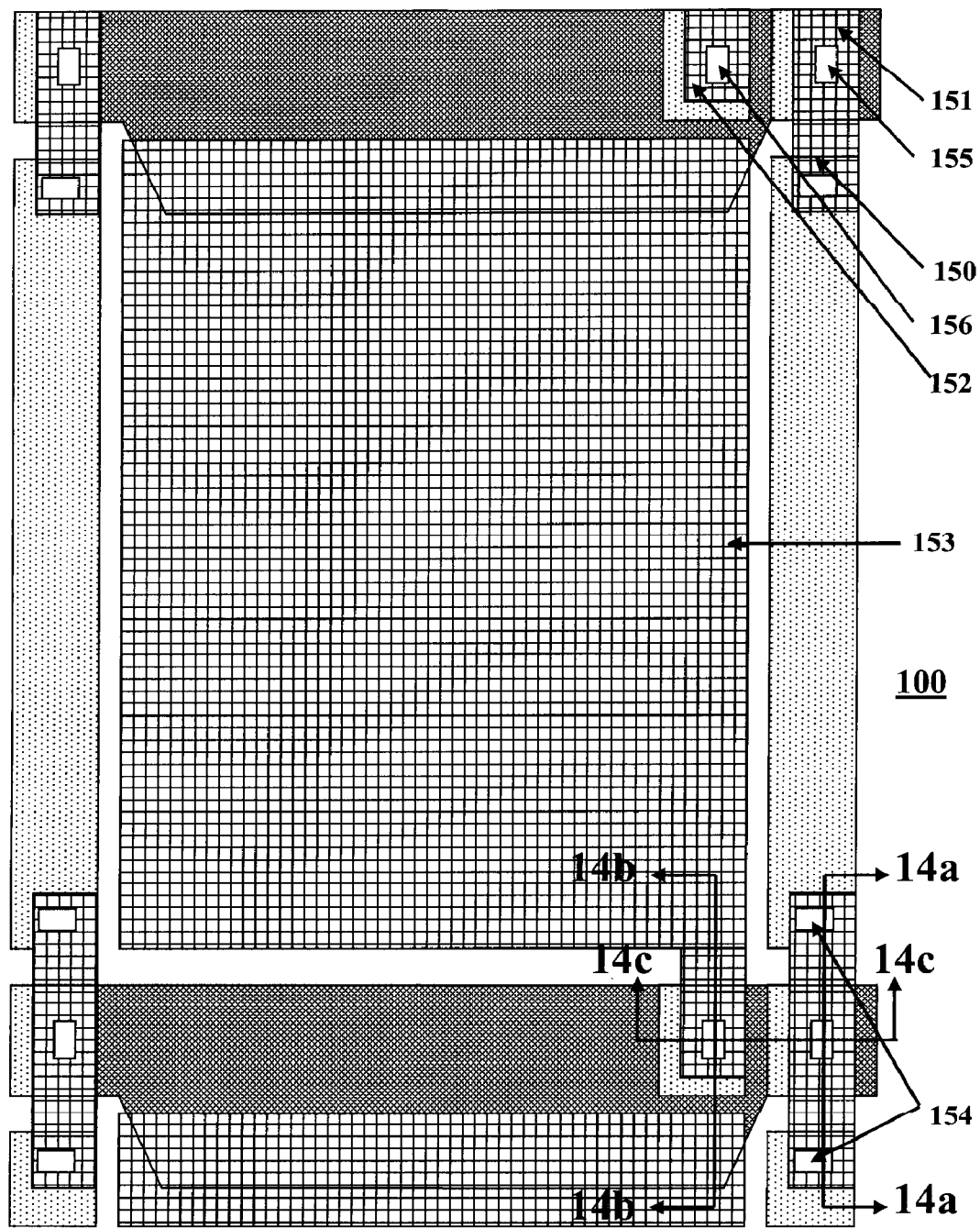
FIG. 13 is a top view showing a single pixel of a TFT LCD array substrate after a photoresist pattern is defined with the second gray tone mask according to the first embodiment of the present invention.
Figure 14A:
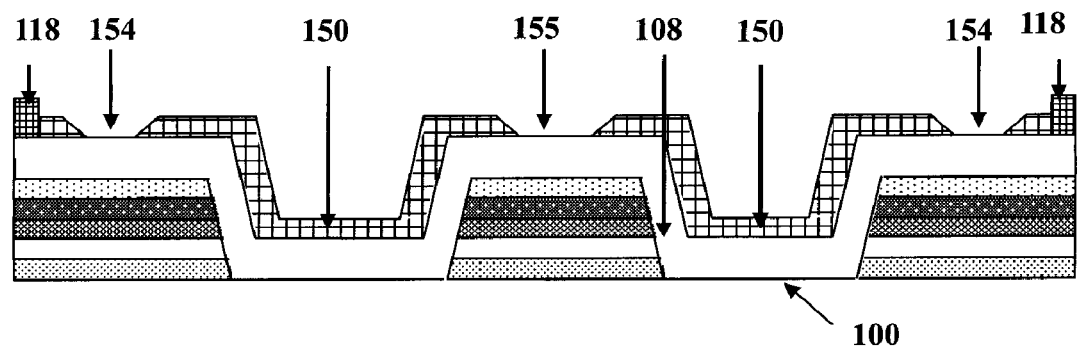
FIG. 14a is a cross-sectional view along the line 14a-14a in FIG. 13.
Figure 14B:
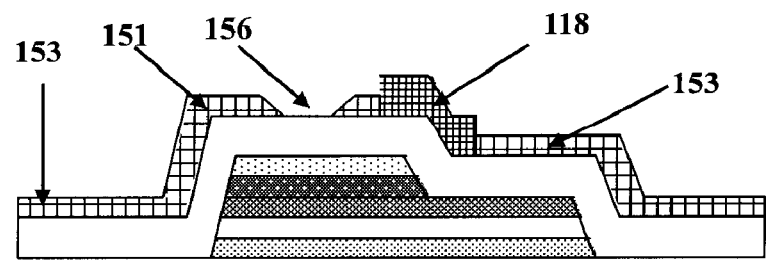
FIG. 14b is a cross-sectional view along the line 14b-14b in FIG. 13.
Figure 14C:
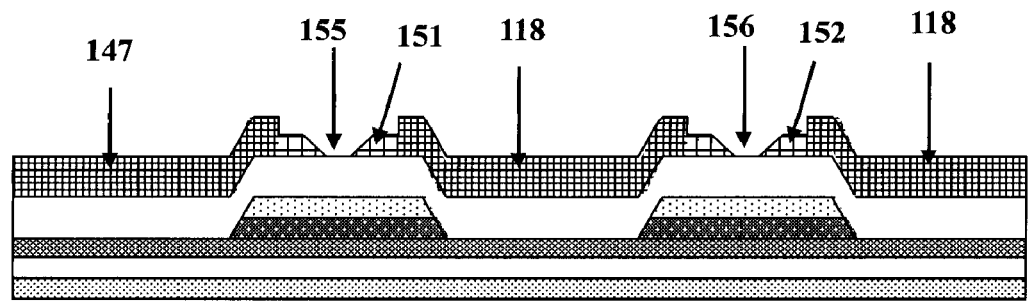
FIG. 14c is a cross-sectional view along the line 14c-14c in FIG. 13.

In the second step of FIG. 8 as shown in FIG. 13 and FIGS. 14a-14c, a passivation protection film 108 is formed on the resultant substrate with the pattern of the data line 105, the source electrode 106, and the drain electrode 107 thereon. The material and manufacture method of the film 108 is similar to those of the gate insulating film 103. The photoresist pattern shown in FIG. 13 is defined with the second gray tone mask. The photoresist pattern comprises: a photoresist-free region, including the photoresist-free via hole 154 over the data line, the photoresist-free via hole 155 over the source electrode and the photoresist-free via hole 156 over the drain electrode; a photoresist partially retained region, including the photoresist 150 over the portion connecting the data lines, the photoresist 151 in the vicinity of the via hole over the source electrode, the photoresist 152 over the portion connecting the drain electrode and the pixel electrode, and the photoresist 153 over the pixel electrode; and a photoresist completely retained region in the rest of the substrate. The photoresist 150 over the portion connecting the data lines and the photoresist 151 in the vicinity of the via hole over the source electrode are connected together to form a continuous photoresist pattern. The photoresist 152 over the portion connecting the drain electrode and the pixel electrode and the photoresist 153 over the pixel electrode are connected together to form a continuous photoresist pattern. The second gray tone mask in this step can be constituted similarly to the first gray tone mask.

Similar to the process of FIGS. 5b-5f, on the substrate with a photoresist pattern defined with the second gray tone mask, the passivation protection film 108 and the transparent conductive film 137 shown in FIG. 6 and FIGS. 7a-7c are formed, thus the TFT LCD array substrate is achieved.

First, with the method similar to that for etching the gate insulating film 103, the via holes 125 on both ends of the data line, the via hole 126 over the source electrode, and the via hole 127 over the drain electrode, as shown in FIG. 6 and FIG. 7a-7c, are formed by etching. Then with the photoresist ashing process, the photoresist in the photoresist partially retained region is removed, and only the photoresist in the photoresist completely retained region is partially retained. During the ashing treatment on the photoresist, the process conditions are controlled so that the photoresist remaining in the photoresist completely retained region 118 possesses a sharp sidewall. At this time, the photoresist 150 over the portion connecting the data lines, the photoresist 151 in the vicinity of the via hole over the source electrode, the photoresist 152 over the portion connecting the drain electrode and the pixel electrode, and the photoresist 153 over the pixel electrode are completely removed, so that the source/drain metal film 115 and the passivation protection thin film 108 previously covered by the photoresist are exposed.

With a method similar to that for forming the gate metal film 131 and the source/drain metal film 115, a layer of transparent conductive film 137 is formed on the entire substrate. The vacuum condition of the sputtering chamber and the electrodes and their accessories are controlled so that no transparent conductive film is deposited on the sidewall of the photoresist in the photoresist completely retained region 118. Then the array substrate is dipped into a chemical solution for photoresist lifting off. With a lifting off process, the photoresist and the transparent conductive film thereon (in the photoresist completely retained region) which has partially retained in thickness after photoresist ashing are removed, while the conductive film in the via holes in the original photoresist-free region and the photoresist partially retained region is retained to form the pixel electrode 110 connected with the drain electrode 107 and the conductive film connecting the data line 105 and the source electrode 106, i.e., the conductive film 128 connecting the data lines. Since no transparent conductive film is deposited on the sidewall of the photoresist in the photoresist completely retained region 118, the ordinary photoresist lifting-off solution, such as the acetone, isopropanol, alcohol, or the mixed solution thereof, can directly etch the photoresist on the sidewall of the photoresist in the photoresist completely retained region 118, and no special lifting-off solution is required to etch other materials like the transparent conductive film. To completely lift off the photoresist as well as the conductive film thereon, excluding that in the pixel portion and the via holes in the passivation film, the lifting-off process is performed together with spraying, vibrating, or supersonic wave. Then the TFT LCD array substrate is completed with a 2Mask process.

The Second Embodiment

Figure 15:
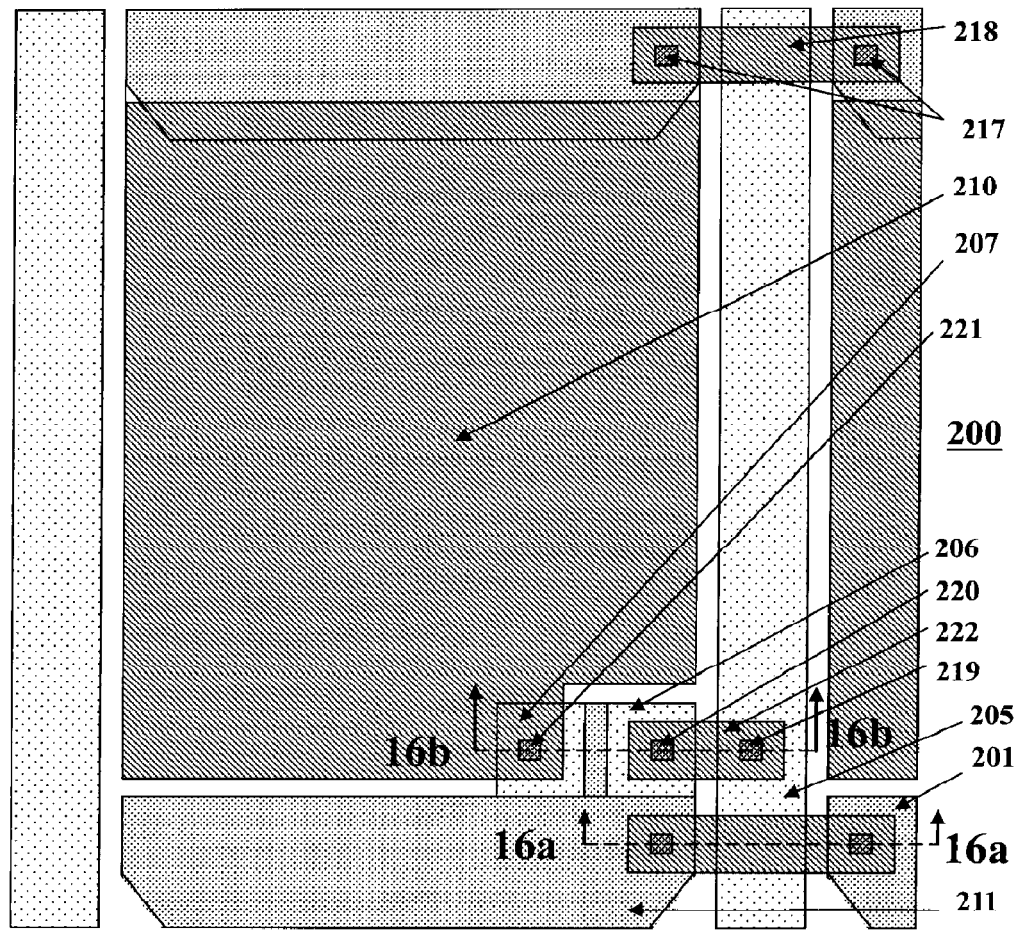
FIG. 15 is a top view showing a single pixel of a TFT LCD array substrate according to the second embodiment of the present invention.
Figure 16A:
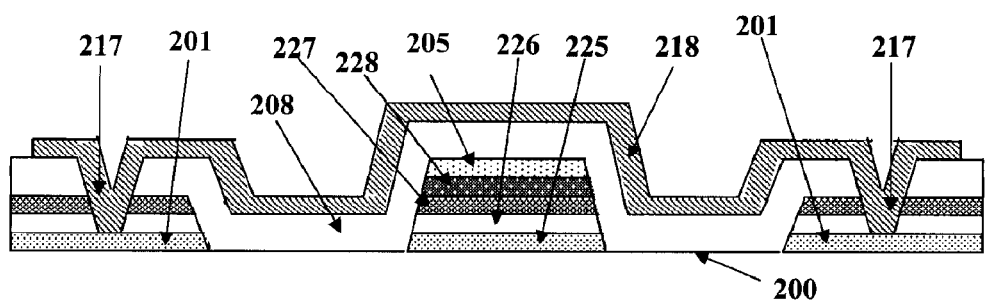
FIG. 16a is a cross-sectional view along the line 16a-16a in FIG. 15.
Figure 16B:
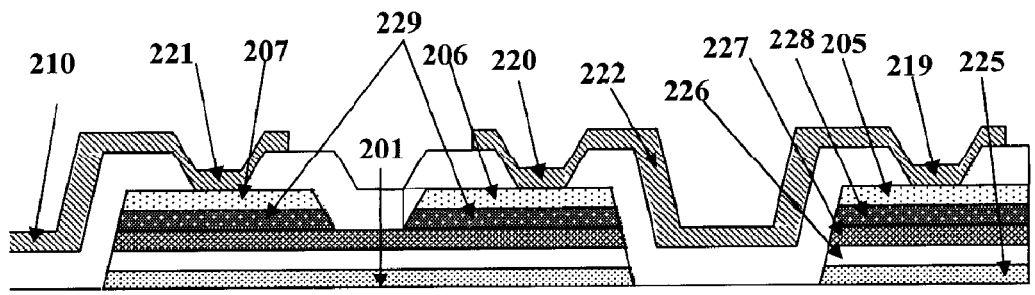
FIG. 16b is a cross-sectional view along the line 16b-16b in FIG. 15.

A TFT LCD array substrate 200 according to the second embodiment of present invention is shown in FIGS. 15, 16a, and 16b. For simplicity, the structure, material, etc which are similar to the first embodiment will not be repeated hereinafter.

The array substrate 200 in the second embodiment comprises a gate line 201 and a data line 205, which are perpendicular to and intersect with each other to define a pixel area. The TFT for each pixel is formed over the gate line 201 in the vicinity of the data line 205. The TFT includes a gate electrode 202, a source electrode 206, a drain electrode 207, a gate insulating film 226, an intrinsic semiconductor film 227 and a doped semiconductor film 228. A storage capacitor is formed between the gate line protrusion part 211 and the pixel electrode 210. The pixel electrode 210 is connected with the drain electrode 207 through the via hole 221 over the drain electrode. Each data line 205 is continuous on the substrate. Each gate line 201 is discontinuous and interrupted by the data line 205 and is connected through the via hole 217 over the both ends of the gate line by the conductive film 218 connecting the gate line. The source electrode 206 is formed over the gate electrode and is connected with the data line 205 through the via hole 220 over the source electrode, the conductive film 222 connecting the data line and the source electrode, and the via hole 219 over the data line.

FIGS. 16a and 16b are cross-sectional views along the line 16a-16a and 16b-16b in FIG. 15, respectively.

As shown, the gate metal film 225 is formed on the transparent substrate, and is made of material with low resistivity and high reflectivity. The gate insulating film 226 and the intrinsic semiconductor film 227 cover all the gate metal film 225, except the lead pads in peripheral region of the array substrate. The ohmic contact film 229 is made of the doped semiconductor film 228, and the doped semiconductor film 228 only retains in the region contacted with the source/drain metal film 236.

The gate line 201 is a part of the discontinuous gate metal film 225 and is covered with the gate insulating film 226, the intrinsic semiconductor film 227, and the passivation protection film 208. The via holes 217 at both ends of the gate line penetrate the passivation protection film 208, the intrinsic semiconductor film 227, and the gate insulating film 226 to expose the gate line 201. The gate line 201 is interrupted by the data line 205 formed by the source/drain metal film 236 and the layers of thin film underlying the data line. The gate metal film 225, the gate insulating film 226, the intrinsic semiconductor film 227, and the doped semiconductor film 228 are also retained under the data line 205. The passivation protection film 208 covers the data line, over which the via hole 219 is in the vicinity of the TFT. Excluding the data line 205 and the gate line 201 as well as the TFT device, no metal thin film exists under the passivation protection film 208. The entire array substrate 200 is covered by a layer of insulating dielectric film, i.e., the passivation protection film 208, and is only opened at the portions for leading out the connecting wire. The conductive film for the connecting wire and the transparent conductive film constituting the pixel electrode may be of the same material and formed with the same mask.

From the figures, the TFT thus manufactured differs from that by the conventional 4Mask process in that, the source electrode and the data line are not connected with each other directly, i.e., the source/drain metal film is disconnected between the source electrode and the data line. The connection of the source/drain metal film is achieved by the transparent conductive film through the via holes. Furthermore, the gate line is discontinuous and is interrupted by the data line. The discontinuous gate line is connected by the transparent conductive film at the via holes. These two differences and the sequential deposition of three layers of thin films described below allow for formation of the array substrate with two masks.

The manufacture process for the array substrate with the above structure will be illustrated by reference to FIGS. 17-25.

Figure 17:
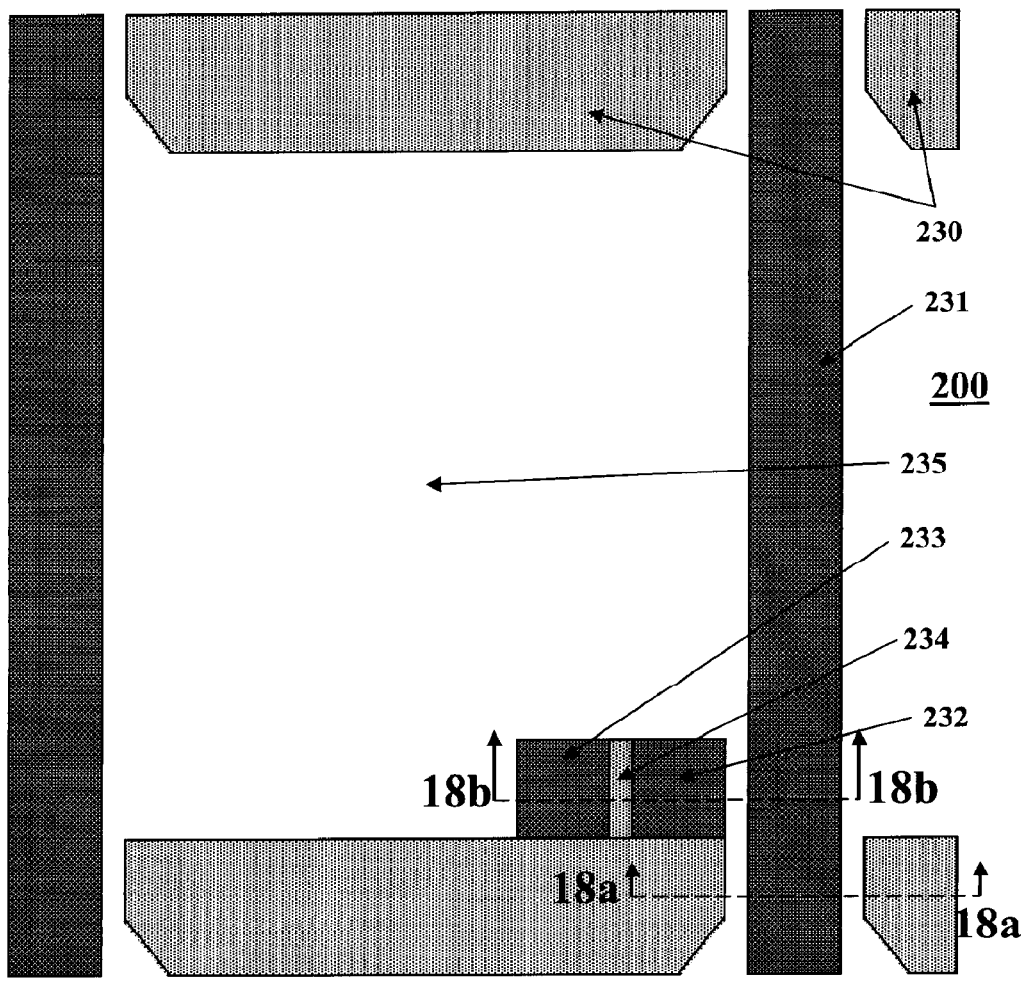
FIG. 17 is a top view showing a single pixel after a photoresist pattern is defined with the first gray tone mask, according to the second embodiment of the present invention.
Figure 18A:
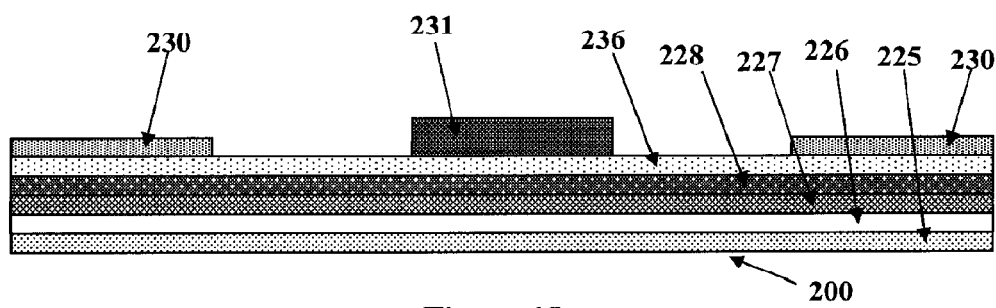
FIG. 18a is a cross-sectional view along the line 18a-18a in FIG. 17.
Figure 18B:
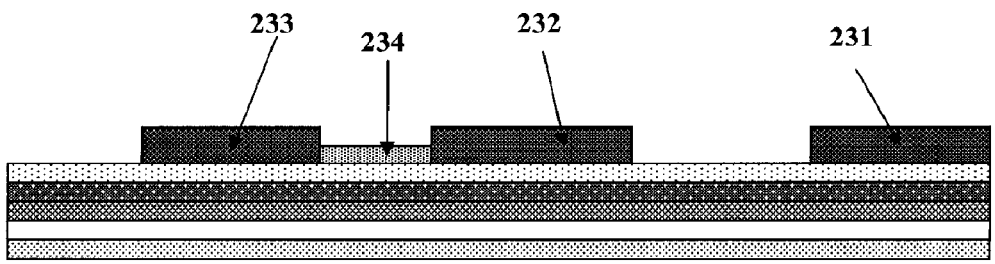
FIG. 18b is a cross-sectional view along the line 18b-18b in FIG. 17.

FIG. 17 is a top view showing the array substrate after the photoresist pattern with different thickness is formed with the first gray tone mask. FIGS. 18*a* and 18*b* are cross-sectional views along the line 18*a*-18*a* and 18*b*-18*b* in FIG. 17, respectively.

As shown in FIGS. 18*a* and 18*b*, the gate metal film 225, the gate insulating film 226, the intrinsic semiconductor film 227, the doped semiconductor film 228, and the source/drain metal film 236 are deposited in order on the transparent insulating substrate. These films may be formed with the same material and the same method as the counterparts in the first embodiment.

As shown in FIGS. 17, 18*a* and 18*b*, a photoresist pattern is formed on the surface of the source/drain metal film 236 with the first gray tone mask. The photoresist pattern comprises a photoresist completely retained region, including the photoresist 231 in the region forming the data line, the photoresist 232 in the region forming the source electrode and the photoresist 233 in the region forming the drain electrode; a photoresist partially retained region, including the photoresist 234 in the region forming the TFT channel, and the photoresist 230 in the region forming the gate line (including the gate line protrusion part); and a photoresist-free region in the rest of the substrate.

Figure 19:
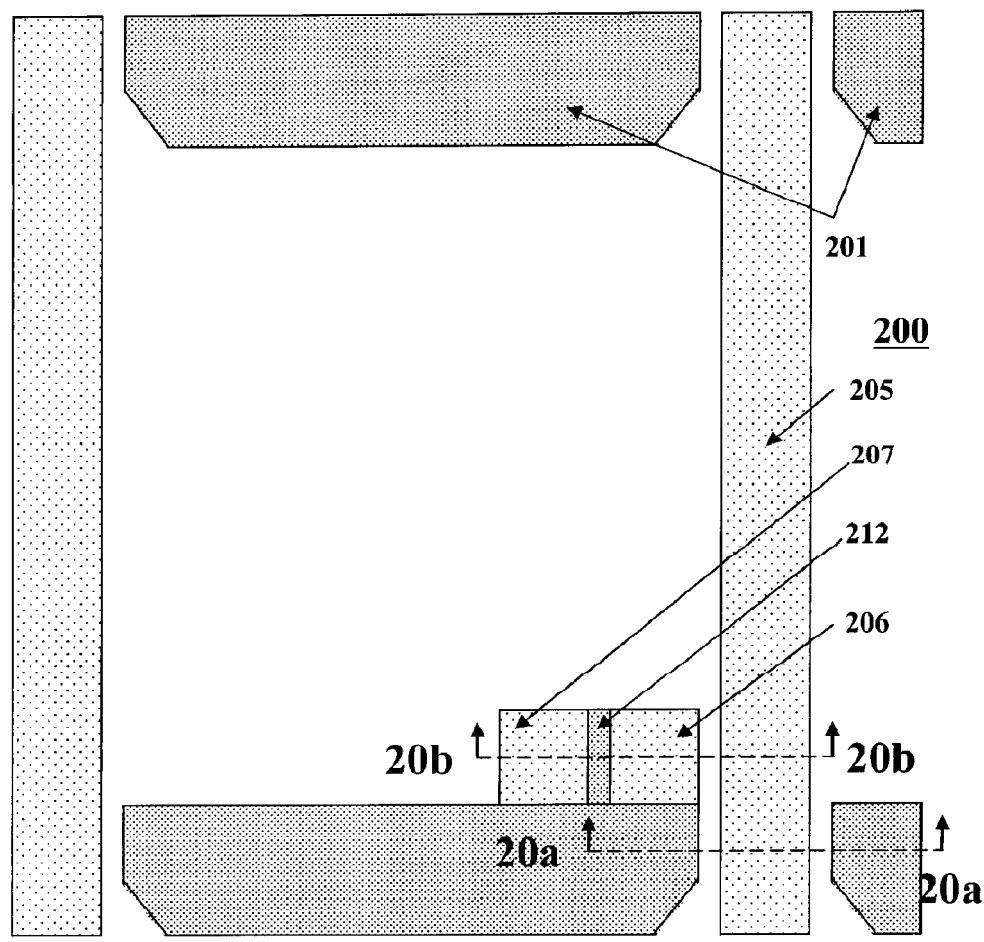
FIG. 19 is a top view showing a single pixel after the photolithography process with the first mask is completed, according to the second embodiment of the present invention.
Figure 20A:
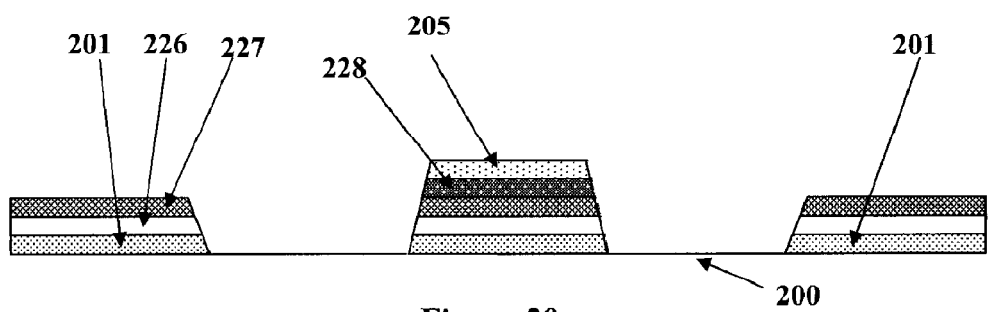
FIG. 20a is a cross-sectional view along the line 20a-20a in FIG. 19.
Figure 20B:
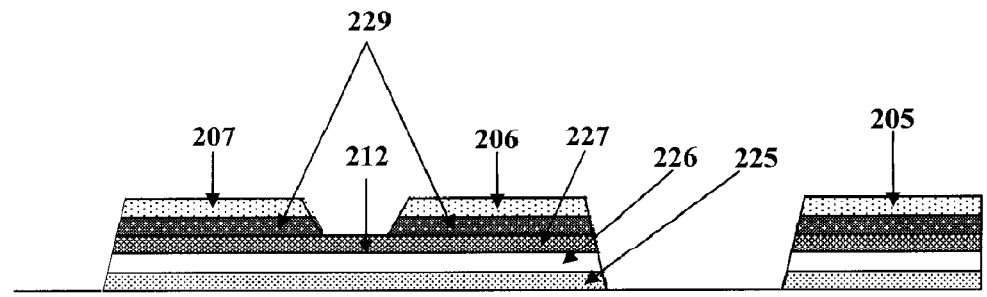
FIG. 20b is a cross-sectional view along the line 20b-20b in FIG. 19.

As shown in the FIGS. 19, 20*a* and 20*b*, the source/drain metal film 236, the doped semiconductor film 228, the intrinsic semiconductor film 227, the gate insulating film 226, and the gate metal film 225 are etched in order to form the data line 205, the source electrode 206, and the drain electrode 207, respectively. Then the photoresist is subject to the photoresist ashing process, so that the photoresist in the photoresist partially retained region, i.e., the photoresist 234 in the region forming the TFT channel and the photoresist 230 in the region forming the gate line (including the gate line protrusion part), is removed, and the photoresist in the photoresist completely retained region, i.e., the photoresist 231 in the region forming the data line, the photoresist 232 in the region forming the source electrode, and the photoresist 233 in the region forming the drain electrode is partially retained. Then the etching of source/drain metal film 236 and the etching of the doped semiconductor film 228 are performed in order to form the gate line 201 (including the gate line protrusion part) and the TFT channel 212. The source/drain metal film 236 establishes an ohmic contact with the doped semiconductor film 228 in the region of the source electrode 206 and the drain electrode 207, thus forming an ohmic contact film 229. Similar to the first embodiment, during the etching process, different etching methods, etching solutions, and etching gases can be used to realize the selection ratio of different materials, the profile, and the critical dimension (CD).

Figure 21:
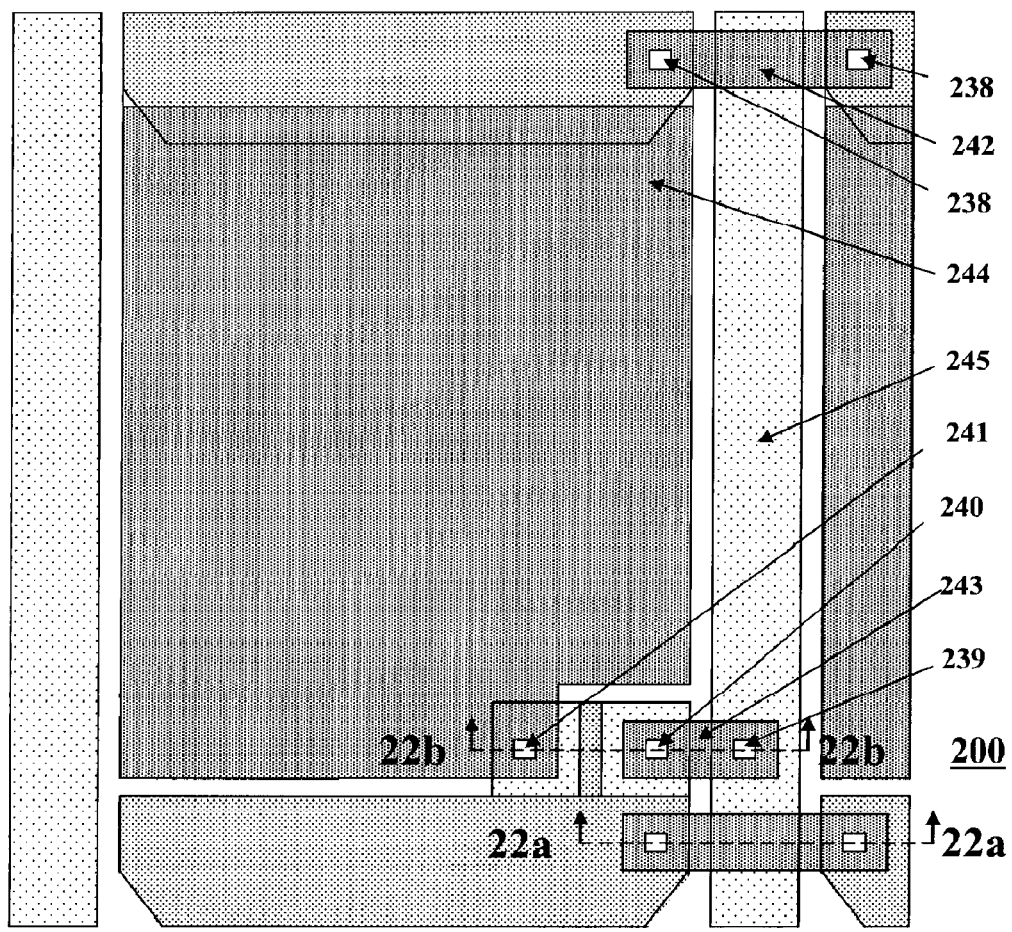
FIG. 21 is a top view showing a single pixel after a photoresist pattern is defined with the second gray tone mask, according to the second embodiment of the present invention.
Figure 22A:
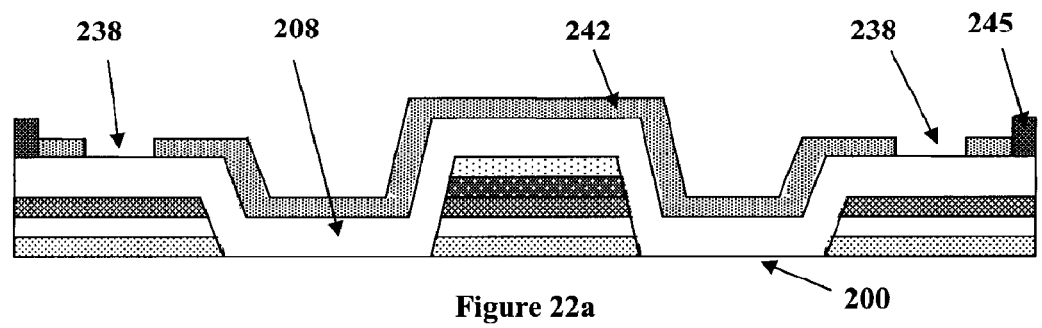
FIG. 22a is a cross-sectional view along the line 22a-22a in FIG. 21.
Figure 22B:
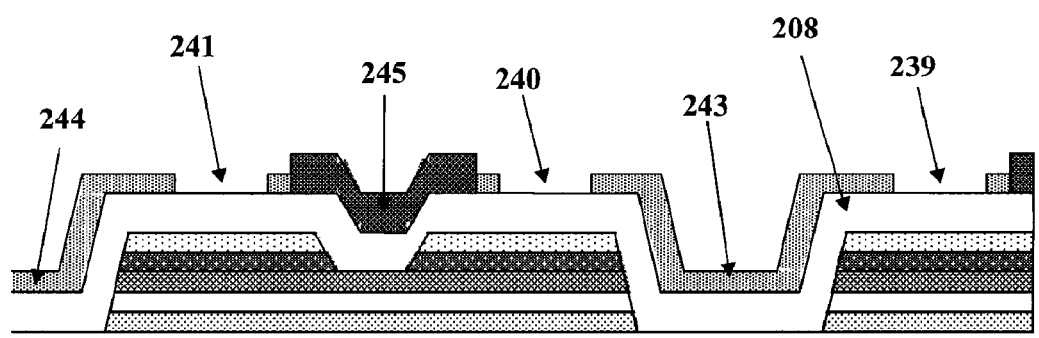
FIG. 22b is a cross-sectional view along the line 22b-22b in FIG. 21.

As shown in FIGS. 21, 22*a* and 22*b*, a layer of passivation protection film 208 and photoresist pattern are formed on the resultant substrate after the first gray tone mask process. The material and manufacture method for the passivation protection film 208 is similar to that for the gate insulating film 226. A photoresist pattern is formed with the second gray tone mask, which comprises a photoresist partially retained region, including the photoresist 242 over the portion connecting the gate line, the photoresist 243 over the portion connecting the data line and the source electrode, and the photoresist 244 in the region of the pixel electrode; a photoresist-free region, including the photoresist-free via holes 238 on both ends of the gate line, the photoresist-free via hole 239 over the data line, the photoresist-free via hole 240 over the source electrode, and the photoresist-free via hole 241 over the drain electrode; and a photoresist completely retained region in the rest of the substrate (except the external lead pads of the gate line and the data line). The photoresist 242 over the portion connecting the gate line, which is across the data line 205, is formed in a region near the via hole 217 over the adjacent segment of gate line 201. The photoresist in the photoresist partially retained region formed near the via hole 219 over the data line and the photoresist in the photoresist partially retained region formed near the via hole 220 over the source electrode are connected together to form a continuous photoresist 243 that connects the data line and the source electrode. The photoresist in the photoresist partially retained region formed near the via hole 221 over the drain electrode and the photoresist in the photoresist partially retained region formed in the pixel forming region are connected together to form a continuous photoresist 244 in the pixel electrode region.

Figure 23A:
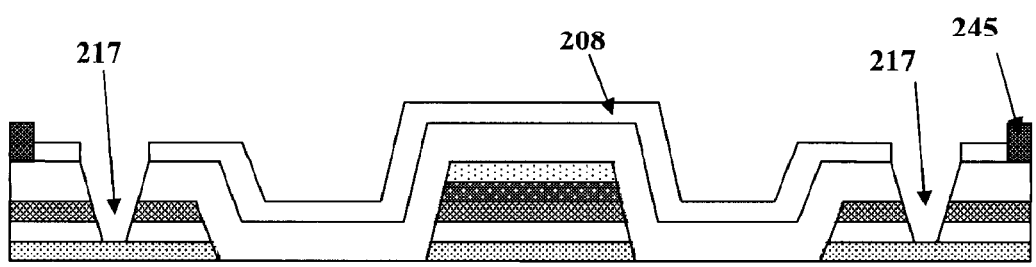
FIG. 23a is a cross-sectional view along the line 23a-23 in FIG. 21 after the photolithography process with the second mask is completed.
Figure 23B:
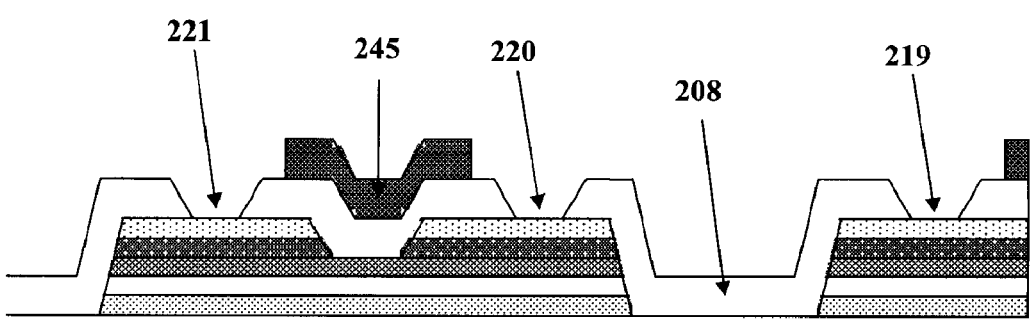
FIG. 23b is a cross-sectional view along the line 23b-23b in FIG. 21.

The etching of the passivation protection film 208, the intrinsic semiconductor film 227, and the gate insulating film 226 are performed successively, to form in the photoresist-free region the via hole 219 over the data line, the via hole 220 over the source electrode, the via hole 221 over the drain electrode, and the via holes 217 over both ends of the gate line, respectively, as shown in FIGS. 23a and 23b. During the etching process, over-etching may be performed to form the respective via holes; by selecting the etch method and the etching gas and tailoring the etching conditions, the source/drain metal film 236 is not etched during the etching of the intrinsic semiconductor film 227 and the gate insulating film 226. Then the photoresist ashing process is used to remove all the photoresist in the photoresist partially retained region and partially retain the photoresist in the photoresist completely retained region. During the photoresist ashing treatment, the process conditions are controlled so that the photoresist remaining in the photoresist completely retained region 245 possesses a sharp sidewall. At this time, the passivation protection film 208 in the original photoresist partially retained region and the metal thin film at the bottom of each via holes are exposed.

Figure 24:
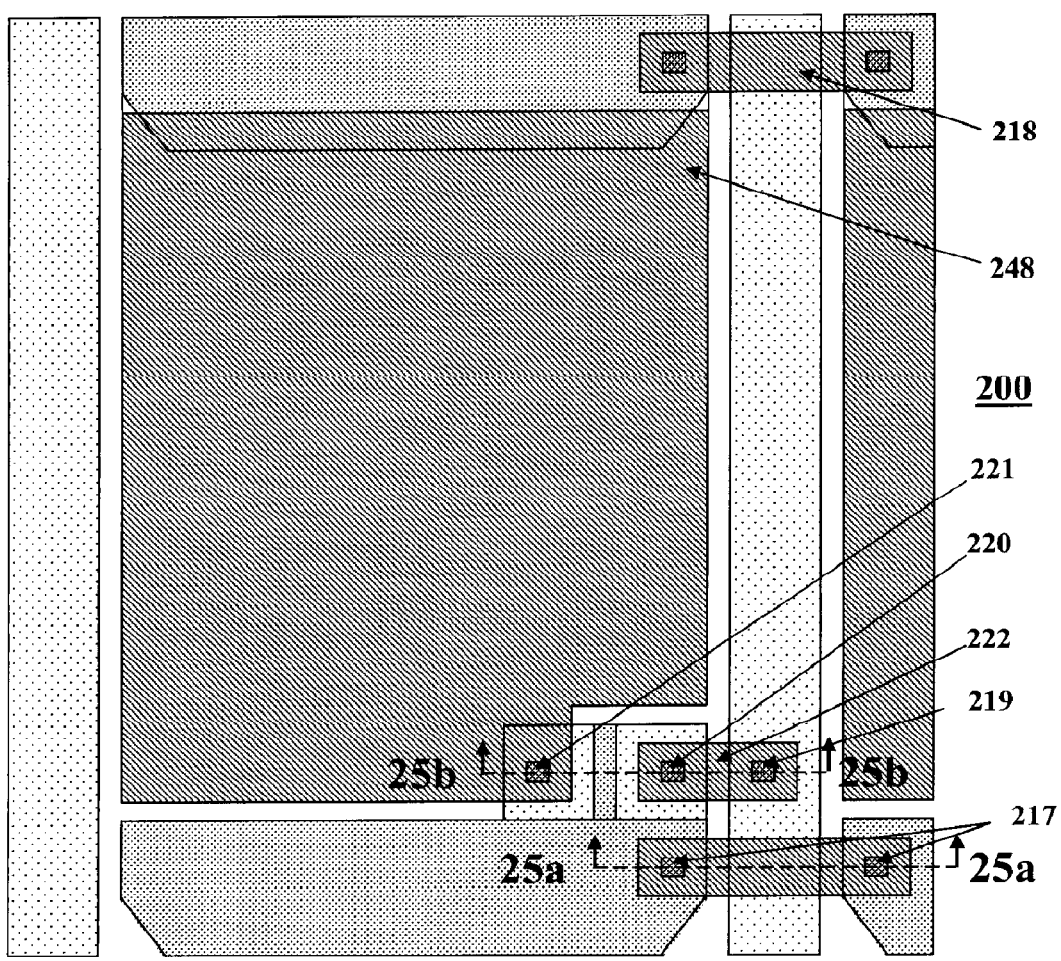
FIG. 24 is a top view showing the pixel after conductive film is deposited, according to the second embodiment of the present invention.
Figure 25A:
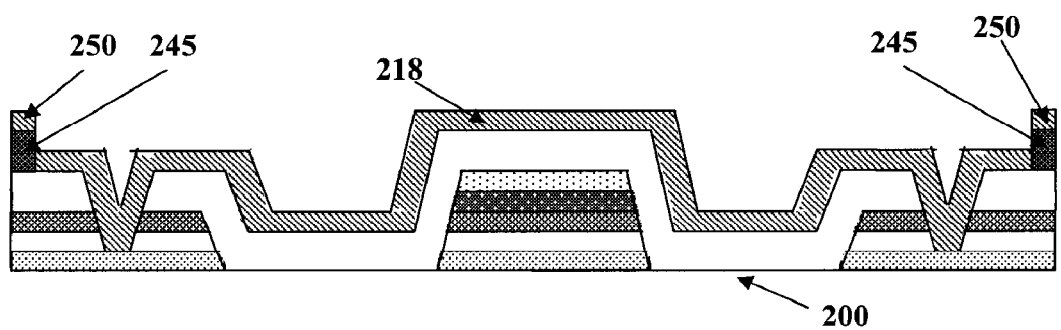
FIG. 25a is a cross-sectional view along the line 25a-25a in FIG. 24.
Figure 25B:
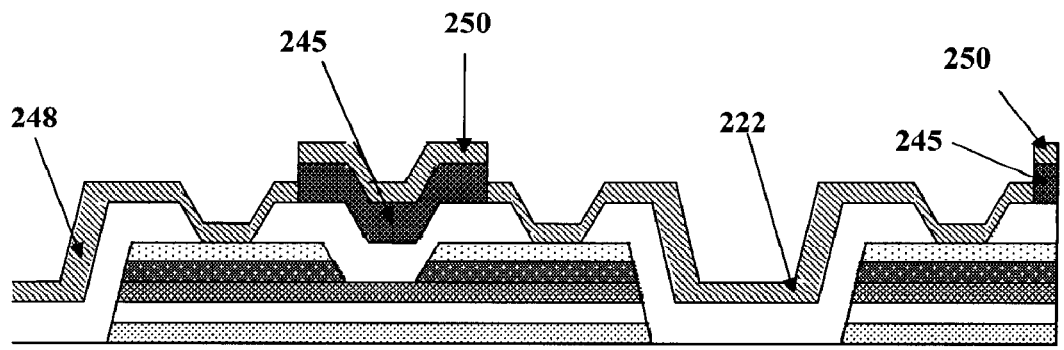
FIG. 25b is a cross-sectional view along the line 25b-25b in FIG. 24.

With a method similar to that of forming the gate metal film and the source/drain metal film, a layer of transparent conductive film 224 is formed on the entire substrate, as shown in FIGS. 24, 25a and 25b. The vacuum condition of the sputtering chamber, the electrodes, and their accessories are controlled so that no transparent conductive film is deposited on the sidewall of the photoresist in the photoresist completely retained region 245. Then the array substrate is immersed into a chemical solution for lifting off. With the lifting off process, the photoresist in the photoresist completely retained region 245 and the transparent conductive film 250 thereon are removed. The conductive film in the original photoresist partially retained region and the via hole forming region (the original photoresist-free region) are retained to form the conductive film 218 connecting the gate line, the conductive film 222 connecting the data line and the source electrode, and the conductive film 248 in the pixel forming region. All the above parts are connected with each other throughout the array substrate through the corresponding via hole. Since no transparent conductive film is deposited on the sidewall of the photoresist in the photoresist completely retained region 245, the ordinary photoresist lifting-off solution can directly etch the photoresist on the sidewall of the photoresist in the photoresist completely retained region 245, and no special lifting-off solution is required to etch other materials like the transparent conductive film. Up to this stage, the TFT LCD array substrate according to the second embodiment is achieved with 2 Mask process.

The TFT structure described in the above examples are not the unique structure of the present invention, and changes such as that in the shape of the source/drain electrode and in the storage capacitor can be realized with the 2 Mask process described above. Other modifications and changes in device structure and manufacture step are also possible, and these modifications and changes do not depart from the spirit and scope of the present invention. Therefore, the present invention comprises all the modifications and changes in accordance with the claims.

It should be appreciated that the embodiments described above illustrate but do not limit the present invention. Although the present invention has been described herein with reference to the preferred embodiments, it is to be understood by those skilled in the art that the present invention can be realized with different material and equipment as necessary, and that various other modification and equivalents can be made herein without departing from the spirit and scope of the present invention.

What is claimed is:

1. A manufacturing method for a thin film transistor (TFT) liquid crystal display (LCD) array substrate, comprising the steps of:
   1) depositing on an insulating substrate in order a gate metal film, a gate insulating film, a semiconductor film, an ohmic contact film, and a source/drain metal film;
   2) forming a first photoresist completely retained region, a first photoresist partially retained region, and a first photoresist-free region on the source/drain metal film with a first gray tone mask;
   3) etching in order the source/drain metal film, the ohmic contact film, the semiconductor film, the gate insulating film, and the gate metal film in the first photoresist-free region;
   4) removing the photoresist in the first photoresist partially retained region, partially retaining the photoresist in the first photoresist completely retained region, and then etching the source/drain metal film and the ohmic contact film in the first photoresist partially retained region to form a gate line and a TFT channel;
   5) removing the partially retained photoresist in the first photoresist completely retained region to form a segmented data line, a source electrode and a drain electrode;
   6) depositing a passivation protection film, and forming on the passivation protection film a second photoresist completely retained region, a second photoresist partially retained region, and a second photoresist-free region with a second gray tone mask;
   7) etching the passivation protection film in the second photoresist-free region to form a source via hole over the source electrode, a drain via hole over the drain electrode, and data via holes over the ends of the segmented data line, respectively;
   8) removing the photoresist in the second photoresist partially retained region, partially retaining the photoresist in the second photoresist completely retained region, and then depositing a layer of transparent conductive film on the resultant substrate; and
   9) removing the remaining partially retained photoresist and the transparent conductive film thereon, retaining the transparent conductive film connecting the segmented data line, the transparent conductive film connecting the segmented data line and the source electrode, and the transparent conductive film in a region of a pixel electrode.

2. The manufacture method according to claim 1, wherein during forming the first photoresist completely retained region, the first photoresist partially retained region, and the first photoresist-free region on the source/drain metal film with the first gray tone mask, the first photoresist completely retained region corresponds to the region for forming the segmented data line, the source electrode and the drain electrode, the first photoresist partially retained region corresponds to the region for forming the TET channel and the gate line, and the first photoresist-free region corresponds to the remaining region of the substrate.

3. The manufacture method according to claim 1, wherein during forming the second photoresist completely retained region, the second photoresist partially retained region, and the second photoresist-free region on the passivation protection film with the second gray tone mask, the second photoresist partially retained region corresponds to the region for forming a portion connecting the segmented data line, a portion connecting the data line and the source electrode, and the pixel electrode, and a portion connecting the pixel electrode and the drain electrode; the second photoresist-free region corresponds to the data via holes over the ends of the data lines, the source via hole over the source electrode, and the drain via hole over the drain electrode; and the second photoresist completely retained region corresponds to the remaining region of the substrate.

4. The manufacture method according to claim 1, wherein etching in order the source/drain metal film, the ohmic contact film, the semiconductor film, the gate insulating film and the gate metal film is performed in different equipment, and wherein the gate metal film and the source/drain metal film are etched by wet etching, and the gate insulating film, the semiconductor film, and the ohmic contact film are etched by dry etching.

5. The manufacture method according to claim 1, wherein etching in order the source/drain metal film, the ohmic contact film, the semiconductor film, the gate insulating film, and the gate metal film are performed in the same equipment by changing the etching gases and conditions to etch each of the films by dry etching.

6. The manufacture method according to claim 1, wherein etching the passivation protection film to form the via holes includes etching in order the passivation protection film, the semiconductor film, and the gate insulating film, and wherein the etching gases and conditions for etching the semiconductor film and those for etching the gate insulating film are different from each other.

7. The manufacture method according to claim 1, wherein when etching the passivation protection film to form via holes, the data via holes over ends of the data line, the source via hole over the source electrode and the drain via hole over the drain electrode are formed simultaneously.

8. The manufacture method according to claim 1, wherein an off-ground lifting-off process is used to remove the remaining photoresist and the conductive film thereon, and wherein lifting-off solution only chemically reacts with the remaining photoresist but not with other material including the transparent conductive film, and the transparent conductive film on the remaining photoresist is removed when the photoresist is lifted off.

9. The manufacture method according to claim 8, wherein the lifting-off solution is selected from the group consisting of acetone, isopropanol, alcohol, or the mixed solution thereof.

10. A manufacturing method for a thin film transistor (TET) liquid crystal display (LCD) array substrate, comprising the steps of:
 1) depositing on an insulating substrate in order a gate metal film, a gate insulating film, a semiconductor film, an ohmic contact film, and a source/drain metal film;
 2) forming a first photoresist completely retained region, a first photoresist partially retained region, and a first photoresist-free region on the source/drain metal film with a first gray tone mask;
 3) etching in order the source/drain metal film, the ohmic contact film, the semiconductor film, the gate insulating film and the gate metal film in the first photoresist-free region;
 4) removing the photoresist in the first photoresist partially retained region, partially retaining the photoresist in the first photoresist completely retained region, and then etching the source/drain metal film and the ohmic contact film to form a segmented gate line and a TFT channel;
 5) removing the partially retained photoresist in the first photoresist completely retained region to form a data line, a source electrode and a drain electrode
 6) depositing a passivation protection film, and forming on the passivation protection film a second photoresist completely retained region, a second photoresist partially retained region, and a second photoresist-free region with a second gray tone mask;
 7) etching the passivation protection film in the second photoresist-free region to form gate via holes over ends of the segmented gate line, a data via hole over the data line, a source via hole over the source electrode, and drain via hole over the drain electrode;
 8) removing the photoresist in the second photoresist partially retained region, partially retaining the photoresist in the second photoresist completely retained region, and then depositing a layer of transparent conductive film on the resultant substrate; and
 9) removing the remaining partially retained photoresist and the transparent conductive film thereon, retaining the transparent conductive film connecting the segmented gate line, the transparent conductive film connecting the data line and the source electrode, and the transparent conductive film in a region of a pixel electrode.

11. The manufacture method according to claim 10, wherein during forming the first photoresist completely retained region, the first photoresist partially retained region, and the first photoresist-free region on the source/drain metal film with the first gray tone mask, the first photoresist completely retained region corresponds to the region forming the data line, the source electrode, and the drain electrode, the first photoresist partially retained region corresponds to the region forming the TFT channel and the segmented gate line, and the first photoresist-free region corresponds to the remaining region of the substrate.

12. The manufacture method according to claim 10, wherein during forming the second photoresist completely retained region, the second photoresist partially retained region, and the second photoresist-free region on the passivation protection film with the second gray tone mask, the second photoresist partially retained region corresponds to the region forming the portion connecting the segmented gate line, the portion connecting the data line and the source electrode, and the pixel electrode; the second photoresist-free region corresponds to the gate via holes on the ends of the gate lines, the data via hole over the data line, the source via hole over the source electrode, and the drain via hole over the drain electrode; and the second photoresist completely retained region corresponds to the remaining region of the substrate.

13. The manufacture method according to claim 10, wherein etching in order the source/drain metal film, the ohmic contact film, the semiconductor film, the gate insulating film and the gate metal film is performed in different equipment, and wherein the gate metal film and the source/drain metal film are etched by wet etching, and the gate insulating film, the semiconductor film, and the ohmic contact film are etched by dry etching.

14. The manufacture method according to claim 10, wherein etching in order the source/drain metal film, the ohmic contact film, the semiconductor film, the gate insulating film and the gate metal film is performed in the same equipment by changing the etching gases and conditions to etch each of the films by dry etching.

15. The manufacture method according to claim 10, wherein etching the passivation protection film to form via holes includes etching in order the passivation protection film, the semiconductor film, the semiconductor film, and the gate insulating film, and wherein the etching gases and conditions for etching the semiconductor film and for the gate insulating film are different from each other.

16. The manufacture method according to claim 10, wherein when etching the passivation protection film to form via holes, the gate via holes over ends of the gate line, the data via hole over the data line, the source via hole over the source electrode and the drain via hole over the drain electrode are formed simultaneously.

17. The manufacture method according to claim 10, wherein an off-ground lifting-off process is used to remove the remaining photoresist and the conductive film thereon, and wherein lifting-off solution only chemically reacts with the remaining photoresist but not with other material including the transparent conductive film, and the transparent conductive film on the remaining photoresist is removed when the photoresist is lifted off.

18. The manufacture method according to claim 17, wherein the lifting-off solution is selected from the group consisting of acetone, isopropanol, alcohol, or the mixed solution thereof.

* * * * *

UNITED STATES PATENT AND TRADEMARK OFFICE
CERTIFICATE OF CORRECTION

PATENT NO. : 7,531,394 B2
APPLICATION NO. : 11/767600
DATED : May 12, 2009
INVENTOR(S) : Chunping Long et al.

Page 1 of 1

It is certified that error appears in the above-identified patent and that said Letters Patent is hereby corrected as shown below:

Column 8, line 62, delete "seem" and insert --sccm--

Column 8, line 63, delete "seem" and insert --sccm--

Column 8, line 66, delete "seem" and insert --sccm--

Column 9, line 8, delete "seem" and insert --sccm--

Column 11, line 31, delete "bc" and insert --be--

Claim 2, column 14, line 56, delete "TET" and insert --TFT--

Claim 10, column 15, line 45, delete "TET" and insert --TFT--

Signed and Sealed this

Twenty-third Day of June, 2009

JOHN DOLL
*Acting Director of the United States Patent and Trademark Office*